US011430942B2

United States Patent
Oguz et al.

(10) Patent No.: US 11,430,942 B2
(45) Date of Patent: Aug. 30, 2022

(54) MULTILAYER FREE MAGNETIC LAYER STRUCTURE FOR SPIN-BASED MAGNETIC MEMORY

(71) Applicant: INTEL CORPORATION, Santa Clara, CA (US)

(72) Inventors: Kaan Oguz, Portland, OR (US); Tanay Gosavi, Hillsboro, OR (US); Sasikanth Manipatruni, Portland, OR (US); Chia-Ching Lin, Portland, OR (US); Gary Allen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 914 days.

(21) Appl. No.: 16/021,425

(22) Filed: Jun. 28, 2018

(65) Prior Publication Data

US 2020/0006625 A1 Jan. 2, 2020

(51) Int. Cl.
*H01L 43/02* (2006.01)
*H01L 43/10* (2006.01)
(Continued)

(52) U.S. Cl.
CPC .............. *H01L 43/02* (2013.01); *G11C 11/161* (2013.01); *H01F 10/329* (2013.01);
(Continued)

(58) Field of Classification Search
CPC ....... H01L 43/02; H01L 27/222; H01L 43/10; H01L 43/12; G11C 11/161;
(Continued)

(56) References Cited

U.S. PATENT DOCUMENTS

2005/0195532 A1* 9/2005 Sugiyama ............. G11C 11/161
                                                      360/322
2008/0088980 A1* 4/2008 Kitagawa ................ G11C 11/16
                                                      360/313

(Continued)

OTHER PUBLICATIONS

Fukami, et al., "A spin-orbit torque switching scheme with collinear magnetic easy axis and current configuration," Nature Nanotechnology, vol. 11, Jul. 2016. pp. 621-626.

*Primary Examiner* — Jami Valentine Miller
(74) *Attorney, Agent, or Firm* — Schwabe, Williamson & Wyatt P.C.

(57) ABSTRACT

A multilayer free magnetic layer structure for spin-based magnetic memory is provided herein. The multilayer free magnetic structure is employed in a magnetic tunnel junction (MTJ) and includes antiferromagnetically coupled magnetic layers. In some cases, the antiferromagnetic coupling is mediated by RKKY interaction with a Ru, Ir, Mo, Cu, or Rh spacer layer. In some cases, low damping magnetic materials, such as CoFeB, FeB, or CoFeBMo are used for the antiferromagnetically coupled magnetic layers. By employing the multilayer free magnetic structure for the MTJ as variously described herein, the critical or switching current can be significantly reduced compared to, for example, an MTJ employing a single-layer free magnetic layer. Thus, higher device efficiencies can be achieved. In some cases, the magnetic layers of the multilayer free magnetic structure are perpendicular magnets, which can be employed, for example, in perpendicular spin-orbit torque (pSOT) memory devices.

23 Claims, 10 Drawing Sheets

(51) Int. Cl.
*H01L 43/12* (2006.01)
*H01L 27/22* (2006.01)
*H01F 41/30* (2006.01)
*H01F 10/32* (2006.01)
*G11C 11/16* (2006.01)

(52) U.S. Cl.
CPC ..... *H01F 10/3254* (2013.01); *H01F 10/3272* (2013.01); *H01F 10/3286* (2013.01); *H01F 41/30* (2013.01); *H01L 27/222* (2013.01); *H01L 43/10* (2013.01); *H01L 43/12* (2013.01)

(58) Field of Classification Search
CPC ............. H01F 10/3254; H01F 10/3272; H01F 10/3286; H01F 10/329; H01F 41/30
USPC ........................................................ 257/421
See application file for complete search history.

(56) References Cited

U.S. PATENT DOCUMENTS

| | | | |
|---|---|---|---|
| 2009/0207724 A1* | 8/2009 | Yanagi | G11C 11/1659 369/283 |
| 2012/0068281 A1* | 3/2012 | Saida | G11C 11/161 257/421 |
| 2019/0013460 A1* | 1/2019 | Ikegawa | H01L 43/02 |
| 2019/0312198 A1* | 10/2019 | Sun | H01L 43/10 |
| 2020/0251650 A1* | 8/2020 | Kim | H01L 27/228 |

* cited by examiner

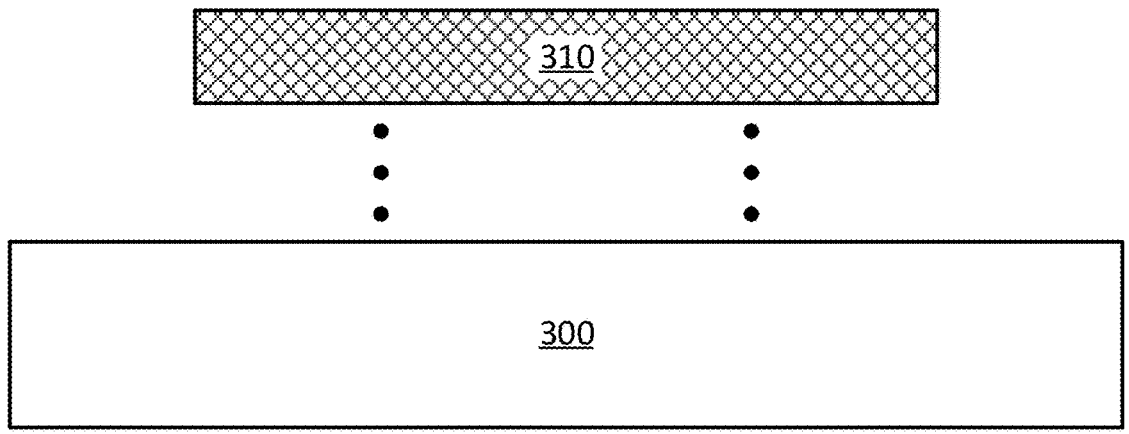
FIG. 3A
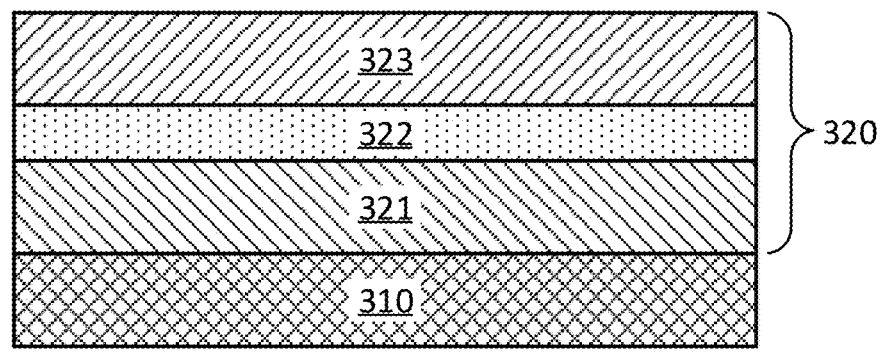
FIG. 3B
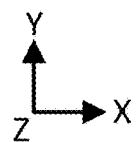

MULTILAYER FREE MAGNETIC LAYER STRUCTURE FOR SPIN-BASED MAGNETIC MEMORY

BACKGROUND

Magnetic-based memory, such as magnetoresistive random-access memory (MRAM), utilizes magnetic storage elements that can hold a magnetization. Some magnetic-based memory devices employ spin-based or spintronic operation in which the orientation or direction of a magnetic storage element can be modified using a spin-polarized current. Example of such spin-based magnetic memory include spin-orbit torque (SOT) memory and spin-transfer torque (STT) memory. Further, such spin-based magnetic memory devices employ a magnetic tunnel junction (MTJ) to store at least one bit of information. An MTJ includes a fixed magnetic layer (or simply, fixed layer) and a free magnetic layer (or simply, free layer) separated by a tunnel barrier layer. The orientation of magnetization in the free magnetic layer relative to the fixed magnetic layer determines whether the MTJ is in a high resistance state or a low resistance state (e.g., whether the MTJ is storing a 1 or a 0). Accordingly, the free magnetic layer is named as such because its magnetization is free to be switched, while the fixed magnetic layer is named as such because its magnetization stays fixed and thereby acts as relative reference for the free magnetic layer. The spin-polarized current needed to switch the magnetic direction in the free magnetic layer of the MTJ (e.g., during a write cycle) is referred to as the critical current or the switching current. As the magnetizations of the MTJ (including the free magnetic layer magnetization orientation) are maintained even when the MTJ receives no power, spin-based magnetic memory is a non-volatile type of memory, which is desirable for many applications.

BRIEF DESCRIPTION OF THE DRAWINGS

FIGS. 3A-3G illustrate cross-sectional views of example IC structures formed when carrying out method 200 of FIG. 2, in accordance with some embodiments. Note that the cross-sectional views in FIGS. 3A-3G are through the multilayer MTJ stack to illustrate the different layers included therein, including the multilayer free magnetic structure described herein. FIGS. 3D' and 3D" illustrate blown-out portions of FIG. 3D to show example multilayer structures of the first and second synthetic antiferromagnet (SAF) stack layers in the multilayer fixed magnetic structure, in accordance with some embodiments.

FIG. 5 illustrates a spin-orbit torque (SOT) memory device.

Figure 1:
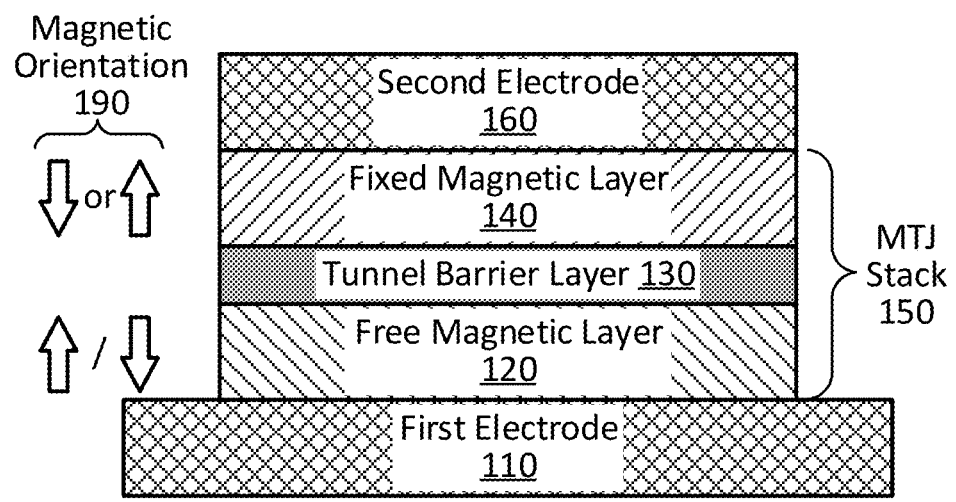
FIG. 1 illustrates a cross-sectional view of an example MTJ stack between a first electrode and a second electrode.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying distinct features. In short, the figures are provided merely to show example structures.

DETAILED DESCRIPTION

As previously stated, the critical current (or switching current) is the spin-polarized current needed to switch the magnetic orientation (or direction) in the free magnetic layer of a magnetic tunnel junction (MTJ). For instance, FIG. 1 illustrates a cross-sectional view of an example MTJ stack 150 between first electrode 110 and second electrode 160. The MTJ stack 150 includes free magnetic layer 120, fixed magnetic layer 140, and tunnel barrier layer 130 between the free magnetic layer 120 and fixed magnetic layer 140. Note that the free magnetic layer 120 may also be referred to as a free layer, and that the fixed magnetic layer 140 may also be referred to as a fixed layer or a reference layer. The fixed magnetic layer 140 has a fixed magnetization (or magnetic polarization), which in this case has a perpendicular (or out-of-plane) direction, where that perpendicular direction is set to either point downward toward free magnetic layer 120 or point upward away from free magnetic layer 120, as shown by the arrows to the left of the layer indicating the magnetic orientation 190. The free magnetic layer 120 has a switchable magnetization that also has a perpendicular direction and can thus be switched (via a switching or critical current) between pointing upward toward fixed magnetic layer 140 and pointing downward away from fixed magnetic layer 140, as shown by the arrows to the left of the layer indicating the magnetic orientation 190. When the free magnetic layer 120 has magnetization that is the same direction as fixed magnetic layer 140, such as where the magnetization of free magnetic layer 120 also points downward, it is referred to as a parallel configuration and results in the lower resistance state for the device. When the free magnetic layer 120 has magnetization that is the opposite direction relative to the fixed magnetic layer 140, such as where the magnetization of free magnetic layer 120 points upward, it is referred to as an antiparallel configuration and results in the higher resistance state for the device.

In spin-based magnetic memory devices that employ MTJs (and where the driving force for switching originates from the spin Hall effect), the critical current is approximately proportional to the product of the saturation magnetization of the free magnetic layer and the thickness of the free magnetic layer. For instance, for perpendicular SOT (pSOT) memory (which may also be referred to as out-of-plane SOT memory), the critical current density $J_C$ is given by equation 1 below:

$$J_C = \frac{2e}{\hbar} \frac{M_S t_F}{\theta_{SH}^{eff}} \left( \frac{H_K^{eff}}{2} - \frac{H_x}{\sqrt{2}} \right) \qquad (1)$$

where e is the elementary charge, h is the Dirac constant, $\theta_{SH}^{eff}$ is the effective spin Hall angle, $M_S$ is the saturation magnetization of the free magnetic layer, $t_F$ is the thickness of the free magnetic layer, and $H_K^{eff}$ is the effective anisotropy field of the free magnetic layer. For in-plane SOT memory, as well as STT memory, the critical current density $J_C$ is also proportional to the product of the saturation magnetization $M_S$ and $t_F$ of the free magnetic layer. As the ferromagnetic materials used for the free magnetic layer have a high saturation magnetization $M_S$, they cause the critical or switching current of the MTJ to be high as well, which is undesirable. Such an issue is exacerbated as spin-based magnetic memory devices, such as SOT and STT memory devices, scale down to smaller and smaller critical dimensions, because such scaling to future technology nodes will require the spin-based magnetic memory devices to employ lower and lower critical currents.

Thus, and in accordance with various embodiments of the present disclosure, a multilayer free magnetic layer structure for spin-based magnetic memory is provided herein. The multilayer free magnetic structure employs antiferromagnetically coupled magnetic layers, where the magnetic layers have opposite magnetic orientations to form a high efficiency free magnetic layer for the memory device. In other words, a free magnetic layer as described herein employs a multilayer stack of two magnetic layers separated by an antiferromagnetic coupling layer. This changes the $M_S t_F$ portion of the above critical current density $J_C$ equation to $M_{S1} t_{F1} - M_{S2} t_{F2}$, where $M_S$ and $t_{F1}$ are the saturation magnetization and thickness, respectively, of the first magnetic layer in the multilayer free magnetic structure, and $M_{S2}$ and $t_{F2}$ are the saturation magnetization and thickness, respectively, of the second magnetic layer in the multilayer free magnetic structure. Therefore, in some embodiments, materials and thicknesses for the first and second magnetic layers can be selected such that $M_{S1} t_{F1} - M_{S2} t_{F2}$ is practically as close to zero as possible, making it a very small value and proportionally decreasing the critical current density $J_C$. Thus, in some such embodiments, the critical current required to switch the magnetic orientation of the multilayer free magnetic structure is significantly less than for MTJs that include free magnetic layers that do not employ such a structure (such as MTJs that employ a single-layer free magnetic layer). Note that in some embodiments, the materials and/or thicknesses of the first and second magnetic layers in the free layer structure may be selected to be intentionally different to ensure that the critical or switching current is still a value greater than the read current, such as at least 2 times the read current, so as to prevent the read current from switching the device, for example.

In some embodiments, the antiferromagnetically coupled magnetic layers of the multilayer free magnetic structure include one or more ferromagnetic materials, such as including one or more of iron (Fe), cobalt (Co), boron (B), molybdenum (Mo), tantalum (Ta), or tungsten (W), to provide some examples. In some such embodiments, low-damping magnetic material is employed for the magnetic layers of the multilayer free magnetic structure, such as magnetic material with a Gilbert damping value (a) of 0.01 or less. Examples of such low-damping magnetic material include CoFeB, FeB, and CoFeBMo, for instance. In some embodiments, the coupling within the multilayer free magnetic structure is mediated by Ruderman-Kittel-Kasuya-Yosida (RKKY) interaction with the coupling (or spacer) layer, such as employing a coupling layer between the magnetic layers that includes one or more of ruthenium (Ru), iridium (Ir), molybdenum (Mo), copper (Cu), or rhodium (Rh), for example.

In some embodiments, the MTJ devices described herein that include a multilayer free magnetic structure can be employed in various different spin-based magnetic memory devices. For instance, in some embodiments, the MTJ devices can be included in SOT memory devices (e.g., SOT-MRAM) that employ three terminals, where the writing is based on a spin-orbit torque (SOT) approach and where the writing and reading operations have separate electrical paths. Further, in some embodiments, the MTJ devices can be included in STT memory devices (e.g., STT-MRAM) that employ two terminals, where the writing is based on a spin-transfer torque (STT) approach and where the writing and reading operations share the same electrical path.

In some embodiments, each magnetic material layer in the multilayer free magnetic structure is a perpendicular or out-of-plane magnet, such that its magnetic orientation is perpendicular to the main plane of the layer, as the designation 'out-of-plane' implies. In other words, in such perpendicular or out-of-plane embodiments, the antiferromagnetically coupled magnetic layers both have magnetizations that are parallel to the main axis of the multilayer stack. In still other words, in such perpendicular or out-of-plane embodiments, the antiferromagnetically coupled magnetic layers both have magnetizations that either point toward the spacer layer or point away from the coupling layer. Such perpendicular antiferromagnetically coupled magnetic layers of the multilayer free magnetic structure can be achieved based on the thickness of the magnetic layers in the structure, such as by employing magnetic layers that have a thickness of at most 2 nm, in accordance with some embodiments. In some embodiments, a device employing an MTJ including such perpendicular magnetic layers are referred to as perpendicular (or out-of-plane) memory devices, such as a perpendicular (or out-of-plane) SOT memory device (which may be referred to as a pSOT memory device), a perpendicular (or out-of-plane) STT memory device, or any other suitable device as will be apparent in light of this disclosure.

In other embodiments, each magnetic material layer in the multilayer free magnetic structure is a parallel or in-plane magnet, such that its magnetic orientation is parallel to the main plane of the layer, as the designation 'in-plane' implies. In other words, in such parallel or in-plane embodiments, the antiferromagnetically coupled magnetic layers both have magnetizations that are perpendicular to the main axis of the multilayer stack. In still other words, in such parallel or in-plane embodiments, the antiferromagnetically coupled magnetic layers both have magnetization directions that do not cross the coupling layer. Such in-plane antiferromagnetically coupled magnetic layers of the multilayer free magnetic structure can be achieved based on the thickness of the magnetic layers in the structure, such as by employing magnetic layers that have a thickness of greater than 2 nm, in accordance with some embodiments. In some embodiments, a device employing an MTJ including such in-plane magnetic layers are referred to as in-plane (or parallel) memory devices, such as an in-plane (or parallel) SOT memory device (which may be referred to as an iSOT memory device), an in-plane (or parallel) STT memory device, or any other suitable device as will be apparent in light of this disclosure.

Note that, as used herein, the expression "X includes at least one of A or B" refers to an X that includes, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that includes just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that is included, for example, in just A only, in just B only, or in both A and B. The above discussion with respect to "X includes at least one of A or B" equally applies here, as will be appreciated. Moreover, this is true for any number of items. Also note that the use of "in the range of" or "between" for a set of values includes the endpoints of that set.

Use of the techniques and structures provided herein can be detected using tools such as: electron microscopy including scanning/transmission electron microscopy (SEMI-TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools can indicate an integrated circuit including a memory device (such as an spin-based magnetic memory device) including a multilayer free magnetic structure of an MTJ as variously described herein. For instance, the structures may be detected by taking a cross-section of an integrated circuit along the MTJ stack to observe the layers described herein, and to identify antiferromagnetically coupled magnetic layers in the free layer portion of the MTJ stack. Further, the MTJ stack may also include a multilayer fixed magnetic structure as variously described herein, which can also be identified using the cross-section along the MTJ stack. In some embodiments, the techniques described herein can be detected based on the structures formed therefrom. In addition, in some embodiments, the techniques and structures described herein can be detected based on the benefits derived therefrom, such as the relatively lower critical or switching currents that can be achieved. Numerous configurations and variations will be apparent in light of this disclosure.

Architecture and Methodology

Figure 2:
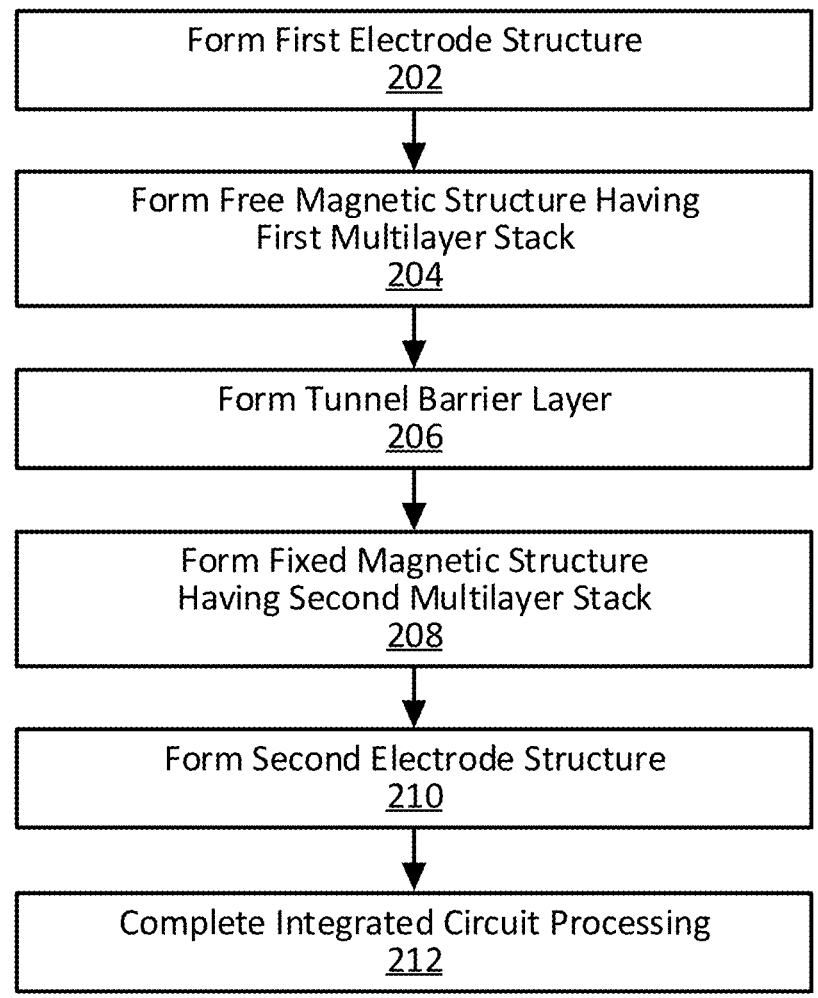
FIG. 2 illustrates method 200 of forming an integrated circuit (IC) including at least one memory device, in accordance with some embodiments

FIG. 2 illustrates method 200 of forming an integrated circuit (IC) including at least one memory device, in accordance with some embodiments. FIGS. 3A-3G illustrate cross-sectional views of example IC structures formed when carrying out method 200 of FIG. 2, in accordance with some embodiments. In more detail, the IC structures relate to an MTJ stack including a multilayer free magnetic structure for spin-based magnetic memory devices. The cross-sectional views in FIGS. 3A-3G are through the multilayer MTJ stack to illustrate the different layers included therein, including the multilayer free magnetic structure described herein. In some embodiments, method 200 is used to form an SOT memory device (e.g., a pSOT or iSOT memory device) or an STT memory device, for example.

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry (or plasma) etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different exposed materials at different rates). Further note that other processing may be used to form the integrated circuits structures described herein as will be apparent in light of this disclosure, such as hard masking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

Method 200 of FIG. 2 includes forming 202 a first electrode structure, such as first electrode structure 310 shown in the example structure of FIG. 3A, in accordance with some embodiments. As shown in FIG. 3A, first electrode structure 310 is formed at least above substrate 300. Thus, in some embodiments, there are one or more intervening layers or features between substrate 300 and first electrode structure 310, while in other embodiments, first electrode structure 310 is formed directly on substrate 300 (such that they are in physical contact). In embodiments including intervening layers or features between the first electrode structure 310 and substrate 300, such intervening layers may include one or more conductive interconnects, one or more seed layers, and/or one or more barrier layers. First electrode structure 310 can be formed using any suitable techniques. For instance, in some embodiments, first electrode structure 310 is formed by blanket depositing the one or more layers included in the first electrode structure 310 and patterning/etching the one or more layers to the desired size and shape, for example. Further, in some embodiments, first electrode structure 310 is formed in a dielectric trench (not shown) by, for example, forming a dielectric layer, forming a trench in the dielectric layer, and then depositing the material of first electrode structure 310 in the dielectric trench, for example.

Substrate 300 is, in some embodiments: a bulk substrate including group IV semiconductor material (such as Si, Ge, and/or SiGe), group III-V semiconductor material, and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material, such that the XOI structure includes the electrically insulating material layer between two semiconductor layers; or some other suitable multilayer structure where the top layer includes one of the aforementioned semiconductor materials (e.g., group IV and/or group III-V semiconductor material). In embodiments where the substrate 300 (or at least the top layer of the substrate, where substrate 300 is a multilayer structure) includes semiconductor material, the semiconductor material may include dopant (e.g., n-type and/or p-type) or the semiconductor material may be undoped/intrinsic. In some embodiments, the substrate can be an insulator or dielectric substrate, such as a glass substrate. For ease of discussion, in some embodiments, it is assumed that the structures described herein are formed above (and in some cases, directly on) a bulk Si substrate. Thus, in such embodiments, substrate 300 is a bulk Si substrate (that either does or does not include dopant), which may be desirable due to the relatively low cost and availability of such bulk Si substrates.

In some embodiments, substrate 300 includes a surface crystalline orientation described by a Miller index of (100), (110), or (111), or its equivalents. Although substrate 300 is shown in the figures as having a thickness (dimension in the Y-axis direction) similar to other layers for ease of illustration, in some instances, substrate 300 is relatively much thicker than the other layers, such as having a thickness in the range of 1 to 950 microns (or in the sub-range of 20 to 800 microns), for example, or any other suitable thickness value or range as will be apparent in light of this disclosure. In some embodiments, substrate 300 is used for one or more other IC devices, such as various transistors (e.g., MOSFETs), various diodes (e.g., light-emitting diodes (LEDs) or laser diodes), various capacitors (e.g., MOSCAPs), various microelectromechanical systems (MEMS), various nanoelectromechanical systems (NEMS), various radio frequency (RF) devices, various sensors, and/or any other suitable semiconductor or IC devices, depending on the end use or target application. Accordingly, in some embodiments, the structures described herein are included in system-on-chip (SoC) applications.

First electrode structure 310, in some embodiments, includes conductive material, such as one or more metals. In some embodiments, first electrode structure 310 includes one or more of tantalum (Ta), tungsten (W), platinum (Pt), bismuth (Bi), iridium (Ir), or manganese (Mn), for example. In some embodiments, first electrode structure 310 includes iridium and manganese, such as in an alloy having a 1:3 ratio of Ir:Mn or where Mn constitutes 75-80 atomic percent of the alloy, for example. In some embodiments, first electrode structure 310 includes platinum and manganese, such as in an alloy having a 1:1 ratio of Pt:Mn or where Mn constitutes 45-55 atomic percent of the alloy, for example. In some embodiments, first electrode structure 310 includes bismuth, such as in a compound with selenium (e.g., bismuth selenide), tellurium (e.g., bismuth telluride), antimony (e.g., bismuth antimonide), and/or oxygen (e.g., bismuth oxide). In some embodiments, first electrode structure 310 has a thickness T0 (as shown in FIG. 3F; dimension in the Y-axis direction) in the range of 2-25 nm (or in a sub-range of 2-5, 2-10, 2-15, 2-20, 4-8, 4-15, 5-10, 5-20, 5-25, 10-15, or 10-25 nm) or greater, or any other suitable thickness value or range as can be understood based on this disclosure. In some embodiments, first electrode structure 310 has a thickness T0 of at least 2, 3, 4, 5, 8, 10, 12, or 15 nm and/or at most 25, 20, 15, 12, 10, or 8 nm, for example. In some embodiments, first electrode structure 310 has a thickness T0 of at most 10 nm, such as to operate as an SOT electrode structure as described herein.

In some embodiments, first electrode structure 310 is considered a spin-orbit torque (SOT) electrode structure for an SOT memory device, because it can provide a torque provided by a spin Hall current that is induced by passing electrical current in a transverse direction through the first electrode structure 310. In some such embodiments, electrons of one spin polarity are directed towards an upper portion of the SOT electrode and electrons with an opposite spin polarity are directed toward a bottom portion of the SOT electrode, for example. For example, in some such embodiments, first electrode structure 310 includes iridium and manganese (e.g., as alloy IrMn), which can generate spin-orbit torque in response to an electric current and can also act as an antiferromagnetic material where the spin domains are antiferromagnetically ordered. Such antiferromagnetic alignment of domains leads to no or minimal net magnetic moment through a volume of the material, making the structure antiferromagnetic. In some embodiments, an external magnetic field is applied to first electrode structure 310 to break the symmetry of the structure, such as during an initial formation process, for example.

Method 200 of FIG. 2 continues with forming 204 a free magnetic structure having a multilayer stack, such as first multilayer stack 320 shown in the example structure of FIG. 3B, in accordance with some embodiments. First multilayer stack 320 of the free magnetic structure can be formed using any suitable techniques. For instance, in some embodiments, the layers of the first multilayer stack 320 may be blanket deposited (at least in an area over first electrode structure 310), for example. Further, in some embodiments, the layers of the first multilayer stack 320 may be formed in a dielectric trench, such as by forming one or more dielectric layers, forming a trench in those one or more dielectric layers, and then forming the materials of first multilayer stack 320 in the dielectric trench, for example. As shown in FIG. 3B, first multilayer stack 320 includes a first magnetic layer 321, a second magnetic layer 323, and a coupling layer 322 between the first and second magnetic layers 321 and 323. As can be understood based on this disclosure, in some embodiments, the first multilayer stack 320 (including at least layers 321/322/323) is a free magnetic structure that replaces the free layer (e.g., a single ferromagnetic free layer) in the MTJ stack of layers 350. In addition, in some embodiments, the first multilayer stack 320 is composed of two magnets (layers 321 and 323) that are antiferromagnetically coupled. Although first multilayer stack 320 is primarily depicted and described herein as having three layers, in other embodiments, it may have additional layers, such as one or more intervening layers between layers 321 and 322 and/or between layers 322 and 323, for instance.

First and second magnetic layers 321 and 323, in some embodiments, include one or more ferromagnetic materials. In some embodiments, magnetic layers 321 and 323 include one or more of iron (Fe), cobalt (Co), boron (B), nickel (Ni), molybdenum (Mo), tantalum (Ta), or tungsten (W). In some embodiments, low-damping magnetic material is employed for one or both of magnetic layers 321 and/or 323, such as magnetic material with a Gilbert damping value (a) of less than 0.015 or 0.01, for instance. Examples of such low-damping magnetic material include CoFeB, FeB, CoB, and CoFeBMo, for instance. In some embodiments, one or both of magnetic layers 321 and/or 323 include iron and/or boron. In some such embodiments, iron may be included in the layer(s) at an atomic percent of 50 to 90, for example.

Further, in some such embodiments, boron may be included in the layer(s) at an atomic percent of 10 to 40, for example. In some embodiments, where W, Ta, and/or Mo are included in one or both of magnetic layers 321 and/or 323, the included individual component of W, Ta, and/or Mo may be included as less than 10 atomic percent of the layer. For instance, in the case of CoFeBMo, the Mo component may be less than 10 atomic percent, in some embodiments.

In some embodiments, one or both of magnetic layers 321 and/or 323 include $Co_{100-x-y}Fe_xB_y$, where X and Y each represent atomic percent. In some such embodiments, X is between 50 and 80 and Y is between 10 and 40, and the sum of X and Y is less than 100. In one such embodiment, X is 60 and Y is 20, such that the material is CoFeB with 20 atomic percent Co, 60 atomic percent iron, and 20 atomic percent boron. In some embodiments, one or both of magnetic layers 321 and/or 323 include FeB having a concentration of boron between 10 and 40 atomic percent. In some embodiments, one or both of magnetic layers 321 and/or 323 include a multilayer structure. For instance, in some such embodiments, the multilayer structure includes alternating magnetic and non-magnetic metals, such as an alternating stack of cobalt and platinum (Co/Pt) layers, cobalt and palladium (Co/Pd) layers, or cobalt nickel (Co/Ni) layers, to provide some examples. In some embodiments, one or both of magnetic layers 321 and/or 323 include grading (e.g., increasing and/or decreasing) the content/concentration of one or more materials through at least a portion of the layer(s), such as the iron and/or boron content/concentration.

In some embodiments, first magnetic layer 321 and second magnetic layer 323 include the same material. In some such embodiments, the same material may be used for both of the magnetic layers 321 and 323 so as to employ layers having the same saturation magnetization $M_S$ to assist with decreasing the critical current density $J_C$ needed to switch the magnetic orientation of the first and second magnetic layers 321 and 323, for example. In some embodiments, first magnetic layer 321 includes compositionally different material from second magnetic layer 323. In some such embodiments where the magnetic layers 321 and 323 include compositionally different material, they may include the same alloy but with components having different concentrations. For instance, to provide an illustrative example, both magnetic layers 321 and 323 may include CoFeB, but one of the magnetic layers may include a higher concentration of at least one of Co, Fe, or B compared to the other magnetic layer, such as one magnetic layer including $Co_{20}Fe_{60}B_{20}$, while the other magnetic layer includes $Co_{40}Fe_{40}B_{20}$. In some such embodiments where the materials of the first and second magnetic layers 321 and 323 are intentionally different, such a configuration may be selected to ensure that the that the critical or switching current is still a value greater than the read current, such as at least 2 times the read current, so as to prevent the read current from switching the device, for example.

In some embodiments, first and second magnetic layers 321 and 323 have thicknesses Ti and T3, respectively (as shown in FIG. 3F; dimensions in the Y-axis direction) in the range of 0.5-5 nm (or in a sub-range of 0.5-1, 0.5-2, 0.5-4, 1-2, 1-3, 1-5, 2-5, or 3-5 nm) or greater, or any other thickness value or range as can be understood based on this disclosure. In some embodiments, first and second magnetic layers 321 and 323 have respective thicknesses Ti and T3 of at least 0.5, 0.8, 1, 1.2, 1.5, 2, 2.2, 2.5, or 3 nm and/or at most 5, 4, 3, 2.5, 2.2, 2, or 1.5 nm, for example. In some embodiments, the thicknesses Ti and T3 may be selected to ensure the first and second magnetic layers 321 and 323 have magnetic orientations that are perpendicular or out-of-plane, such as by having thicknesses Ti and T3 of at most 2 nm, for example. However, in some such embodiments, slightly greater thicknesses for Ti and T3 may be employed (e.g., up to 3 nm) while still achieving perpendicular magnetic orientations as a result of magnetic layers 321 and 323 being in first multilayer stack 320. Regardless, in some such embodiments, a thickness of exactly 1 nm or approximately 1 nm (e.g., 1 nm within 0.2 nm, such as 0.8-1.2 nm) may be employed for Ti and T3 to ensure a perpendicular magnetic orientation. In other embodiments, the thicknesses Ti and T3 may be selected to ensure the first and second magnetic layers 321 and 323 have magnetic orientations that are in-plane or parallel, such as by having thicknesses Ti and T3 of greater than 2 or 3 nm, for example.

In some embodiments, first and second magnetic layers 321 and 323 have thicknesses Ti and T3 that are the same value or approximately the same value (e.g., within 0.1 nm of each other). In some such embodiments, the same thicknesses may be used for both of the magnetic layers 321 and 323 to assist with decreasing the critical current density $J_C$ needed to switch the magnetic orientation of the first and second magnetic layers 321 and 323, for example. In some embodiments, first and second magnetic layers 321 and 323 have respective thicknesses Ti and T3 that are intentionally different, such as differing by at least 0.1, 0.2, 0.3, 0.5, 0.8, or 1 nm. In some such embodiments where the thicknesses Ti and T3 of the first and second magnetic layers 321 and 323, respectively, are intentionally different, such a configuration may be selected to ensure that the that the critical or switching current is still a value greater than the read current, such as at least 2 times the read current, so as to prevent the read current from switching the device, for example.

Coupling (or spacer) layer 322, in some embodiments, includes one or more non-magnetic metals. In some embodiments, coupling layer 322 includes one or more of ruthenium (Ru), iridium (Ir), molybdenum (Mo), copper (Cu), or rhodium (Rh), for example. In an example embodiment, coupling layer 322 is a ruthenium layer. In some embodiments, coupling layer 322 provides means for antiferromagnetically coupling first and second magnetic layers 321 and 323. In some such embodiments, the antiferromagnetic coupling is mediated by Ruderman-Kittel-Kasuya-Yosida (RKKY) interaction with the coupling layer 322. In some embodiments, coupling layer 322 includes a multilayer structure of two or more materially distinct sub-layers. In some embodiments, coupling layer 322 has a thickness T2 (as shown in FIG. 3F; dimension in the Y-axis direction) in the range of 0.2-3 nm (or in a sub-range of 0.2-0.8, 0.2-1, 0.2-1.2, 0.2-1.5, 0.2-2, 0.4-1.2, 0.5-1, 0.5-2, 0.5-3, 0.8-2, 1-2, 1-3, or 2-3 nm) or greater, or any thickness value or range as can be understood based on this disclosure. In some embodiments, coupling layer 322 has a thickness T2 of at least 0.2, 0.4, 0.5, 0.8, 1, 1.2, or 1.5 nm and/or at most 3, 2.5, 2, 1.8, 1.5, 1.2, 1, or 0.8 nm, for example. In some example embodiments, coupling layer 322 has a thickness T2 of 0.4, 0.8-0.9, or 1.7-1.8 nm to provide a desired coupling effect.

Figure 3C:
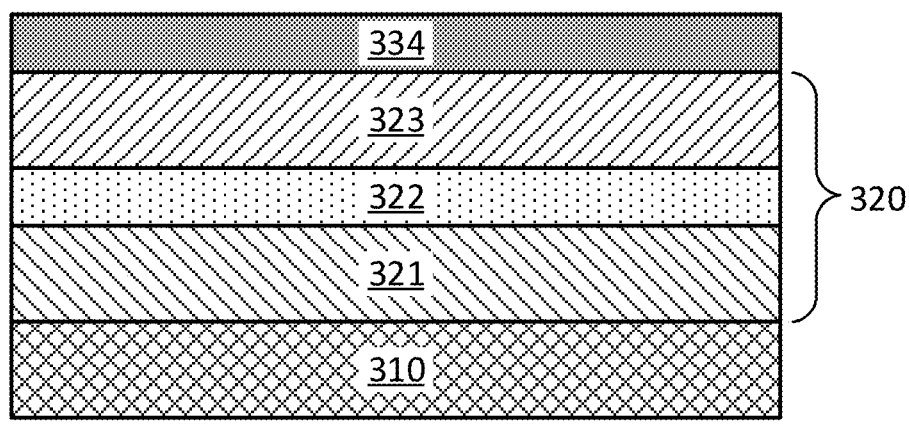

Method 200 of FIG. 2 continues with forming 206 a tunnel barrier layer, such as tunnel barrier layer 334 shown in the example structure of FIG. 3C, in accordance with some embodiments. Tunnel barrier layer 334 can be formed using any suitable techniques. For instance, in some embodiments, tunnel barrier layer 334 may be blanket deposited (at least in an area over first multilayer stack 320), for example. Further, in some embodiments, tunnel barrier layer 334 may be formed in a dielectric trench, such as by forming one or more dielectric layers, forming a trench in those one or more dielectric layers, and then forming the material of tunnel barrier layer 334 in the dielectric trench, for example.

Tunnel barrier layer 334, in some embodiments, includes one or more electrical insulator or dielectric materials. In some embodiments, tunnel barrier layer 334 includes oxygen and one or more metals. In some such embodiments, the one or more metals include magnesium and/or aluminum. For instance, in some embodiments, tunnel barrier layer 334 includes magnesium and oxygen, such as being a layer of magnesium oxide (e.g., MgO), for example. In some embodiments, tunnel barrier layer 334 includes aluminum and oxygen, such as being a layer of aluminum oxide ($Al_2O_3$), for example. In some embodiments, tunnel barrier layer 334 includes aluminum, magnesium, and oxygen, such as being a layer of magnesium aluminum oxide (e.g., $MgAl_2O_4$), which may be referred to as spinel, for example. In some embodiments, tunnel barrier layer 334 has a single crystal or monocrystalline (or simply, crystalline) structure. In some embodiments, tunnel barrier layer 334 includes material that provides means for allowing electrons to tunnel through the layer, between multilayer free magnetic structure 320 and multilayer fixed magnetic structure 340, for instance. In some embodiments, tunnel barrier layer 334 has a thickness T4 (as shown in FIG. 3F; dimension in the Y-axis direction) in the range of 0.5-2 nm (or in a sub-range of 0.5-0.8, 0.5-1, 0.5-1.2, 0.5-1.5, 0.8-1.2, 1-1.5, 1-2, or 1.5-2 nm) or greater, or any other thickness value or range as can be understood based on this disclosure. In some embodiments, tunnel barrier layer 334 has a thickness T4 of at least 0.5, 0.8, 1, 1.2, or 1.5 nm and/or at most 2, 1.8, 1.5, 1.2, or 1 nm, for example.

Figure 3D:
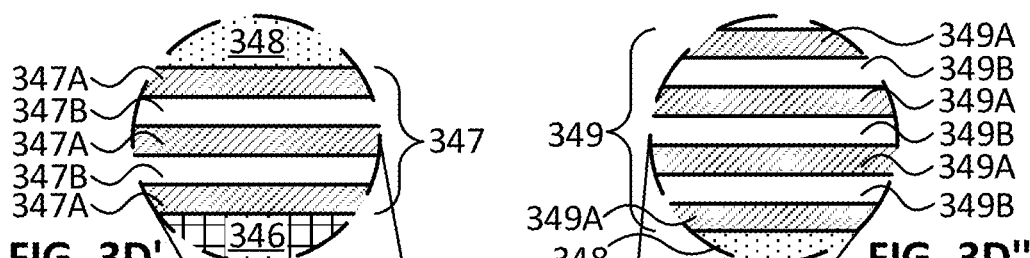
Figure 3D:
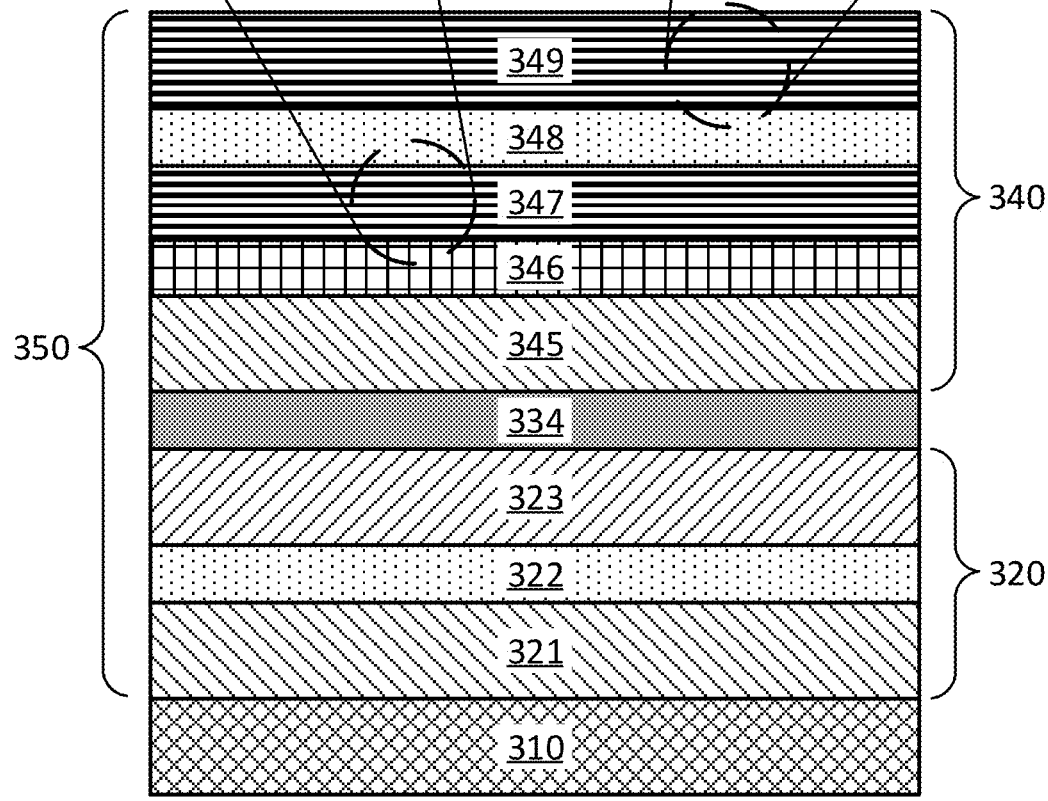

Method 200 of FIG. 2 continues with forming 208 a fixed magnetic structure having a multilayer stack, such as second multilayer stack 340 shown in the example structure of FIG. 3D, in accordance with some embodiments. Second multilayer stack 340 of the fixed magnetic structure can be formed using any suitable techniques. For instance, in some embodiments, the layers of the second multilayer stack 340 may be blanket deposited (at least in an area over tunnel barrier layer 334), for example. Further, in some embodiments, the layers of the second multilayer stack 340 may be formed in a dielectric trench, such as by forming one or more dielectric layers, forming a trench in those one or more dielectric layers, and then forming the materials of second multilayer stack 340 in the dielectric trench, for example. As shown in FIG. 3D, second multilayer stack 340 includes a third magnetic layer 345, a filter layer 346, a first synthetic antiferromagnetic (SAF) stack layer 347, a second SAF stack layer 349, and an SAF stack coupling layer 348 between the SAF stack layers 347 and 349 (where the 347/348/349 stack is a synthetic antiferromagnet). As can be understood based on this disclosure, in some embodiments, the second multilayer stack 340 (including at least layers 345/346/347/348/349) is a fixed magnetic structure that replaces the fixed layer (e.g., a single ferromagnetic fixed layer) in the MTJ stack of layers 350. Thus, second multilayer stack 340 acts as a magnetic reference for the first multilayer stack 320 of the MTJ device. Although second multilayer stack 340, which is the multilayer fixed magnetic structure, is primarily depicted and described herein as having five layers, in other embodiments, it may have additional layers, such as one or more intervening layers, for instance.

Third magnetic layer 345, in some embodiments, includes one or more ferromagnetic materials. In some embodiments, third magnetic layer 345 includes one or more of iron (Fe), cobalt (Co), boron (B), nickel (Ni), molybdenum (Mo), tantalum (Ta), or tungsten (W). In some embodiments, low-damping magnetic material is employed for third magnetic layer 345, such as magnetic material with a Gilbert damping value (a) of less than 0.015 or 0.01, for instance. Examples of such low-damping magnetic material include CoFeB, FeB, CoB, and CoFeBMo, for instance. In some embodiments, third magnetic layer 345 includes iron and/or boron. In some such embodiments, iron may be included in the layer(s) at an atomic percent of 50 to 90, for example. Further, in some such embodiments, boron may be included in the layer(s) at an atomic percent of 10 to 40, for example. In some embodiments, where W, Ta, and/or Mo are included in third magnetic layer 345, the included individual component of W, Ta, and/or Mo may be included as less than 10 atomic percent of the layer. For instance, in the case of CoFeBMo, the Mo component may be less than 10 atomic percent, in some embodiments. In an example embodiment, third magnetic layer 345 is a CoFeB layer.

In some embodiments, third magnetic layer 345 includes $Co_{100-x-y}Fe_xB_y$, where X and Y each represent atomic percent. In some such embodiments, X is between 50 and 80 and Y is between 10 and 40, and the sum of X and Y is less than 100. In one such embodiment, X is 60 and Y is 20, such that the material is CoFeB with 20 atomic percent Co, 60 atomic percent iron, and 20 atomic percent boron. In some embodiments, third magnetic layer 345 includes FeB having a concentration of boron between 10 and 40 atomic percent. In some embodiments, third magnetic layer 345 includes a multilayer structure. For instance, in some such embodiments, the multilayer structure includes alternating magnetic and non-magnetic metals, such as an alternating stack of cobalt and platinum (Co/Pt) layers, cobalt and palladium (Co/Pd) layers, or cobalt and nickel (Co/Ni) layers, to provide some examples. In some embodiments, third magnetic layer 345 includes grading (e.g., increasing and/or decreasing) the content/concentration of one or more materials through at least a portion of the layer, such as the iron and/or boron content/concentration. In some embodiments, third magnetic layer 345 includes the same material as one or both of first and second magnetic layers 321 and/or 323. In some embodiments, third magnetic layer 345 includes compositionally different material from one or both of first and second magnetic layers 321 and/or 323.

In some embodiments, third magnetic layer 345 has a thickness T5 (as shown in FIG. 3F; dimension in the Y-axis direction) in the range of 0.5-5 nm (or in a sub-range of 0.5-1, 0.5-2, 0.5-4, 1-2, 1-3, 1-5, 2-5, or 3-5 nm) or greater, or any other thickness value or range as can be understood based on this disclosure. In some embodiments, third magnetic layer 345 has thickness T5 of at least 0.5, 0.8, 1, 1.2, 1.5, 2, 2.2, 2.5, or 3 nm and/or at most 5, 4, 3, 2.5, 2.2, 2, or 1.5 nm, for example. In some embodiments, the thickness T5 may be selected to ensure the third magnetic layer 345 had a magnetic orientation that is perpendicular or out-of-plane, such as by having a thickness T5 of at most 2 nm, for example. Regardless, in some such embodiments, a thickness of exactly 1 nm or approximately 1 nm (e.g., 1 nm within 0.2 nm, such as 0.8-1.2 nm) is employed for thickness T5 to, for instance, ensure a perpendicular magnetic orientation. In other embodiments, thickness T5 may be selected to ensure the third magnetic layer 345 has a magnetic orientation that is in-plane or parallel, such as by having a thickness T5 of greater than 2 nm, for example.

Filter layer 346, in some embodiments, includes one or more non-magnetic metals. In some embodiments, filter layer 346 includes one or more of tantalum (Ta), molybdenum (Mo), tungsten (W), or ruthenium (Ru). In an example embodiment, filter layer 346 is a tantalum layer. In some embodiments, filter layer 346 includes material that provides means for preventing iron from third magnetic layer 345 from diffusing into the first SAF stack layer 347 and/or means for allowing boron to diffuse from third magnetic layer 345 into first SAF stack layer 347, for example. In some embodiments, filter layer 346 has a thickness T6 (as shown in FIG. 3F; dimension in the Y-axis direction) in the range of 0.2-1 nm (or in a sub-range of 0.2-0.4, 0.2-0.6, 0.2-0.8, 0.3-0.5, 0.3-1, 0.5-0.8, or 0.5-1 nm) or greater, or any other thickness value or range as can be understood based on this disclosure. In some embodiments, filter layer 346 has a thickness T6 of at least 0.2, 0.3, 0.4, or 0.5 nm and/or of at most 1, 0.8, 0.6, or 0.5 nm, for example. In an example embodiment, filter layer 346 has a thickness of exactly 0.3 nm or approximately 0.3 nm (e.g., 0.3 nm within 0.1 nm, such as 0.2-0.4 nm) to, for instance, ensure desired filtering functionality for layer 346.

First and second SAF stack layers 347 and 349, in some embodiments, include multilayer structures of alternating magnetic and non-magnetic layers. For instance, FIGS. 3D' and 3D" illustrate blown-out portions of FIG. 3D to show example multilayer structures of first and second SAF stack layers 347 and 349, in accordance with some embodiments. In more detail, FIG. 3D' illustrates an example multilayer structure for SAF stack layer 347 including alternating magnetic layers 347A and non-magnetic layers 347B. In addition, FIG. 3D" illustrates an example multilayer structure for SAF stack layer 349 including alternating magnetic layers 349A and non-magnetic layers 349B. Note that in both of the multilayer structures for SAF stack layers 347 and 349, the bottom-most and top-most layers in those structures are magnetic layers (ending with A, such as 347A and 349A). Thus, although there may be N number of sets of alternating layers, an additional magnetic layer is included to sandwich the structure with magnetic layers, in accordance with some embodiments. Also note that although there are 2 sets of alternating magnetic and non-magnetic layers shown for SAF stack layer 347 in FIG. 3D' (plus the additional magnetic layer, to create the 347A/347B/347A/347B/347A stack) and 3 sets of alternating magnetic and non-magnetic layers shown for SAF stack layer 349 in FIG. 3D" (plus the additional magnetic layer, to create the 349A/349B/349A/349B/349A/349B/349A stack), the layers are not intended to be limited to 2 or 3 sets of alternating magnetic and non-magnetic layers, unless otherwise explicitly stated. In some embodiments, 1-10 sets (or 1-5, 1-8, 2-6, 2-8, 3-5, 3-10, 5-10, 6-8, or 6-10 sets) or even more sets of alternating magnetic and non-magnetic layers (plus the additional magnetic layer to complete the stack) can be employed for SAF stack layers 347 and 349. In an example embodiment, first SAF stack layer 347 includes 3-5 sets of alternating magnetic and non-magnetic layers (plus the additional magnetic layer to complete the stack), and second SAF stack layer 349 includes 6-7 sets of alternating magnetic and non-magnetic layers (plus the additional magnetic layer to complete the stack).

In some embodiments, the magnetic layers (347A layers and 349A layers) in the multilayer structures of layers 347 and 349 include one or more ferromagnetic materials, such as one or more of cobalt (Co), nickel (Ni), or iron (Fe). In some embodiments, the magnetic layers (347A layers and 349A layers) in the multilayer structures of layers 347 and 349 have thicknesses (dimensions in the Y-axis direction) in the range of 0.2-0.8 nm (or in a sub-range of 0.2-0.4, 0.2-0.6, 0.3-0.5, or 0.4-0.8 nm) or greater, or any other thickness value or range as can be understood based on this disclosure. In some embodiments, the non-magnetic layers (347B layers and 349B layers) in the multilayer structures of layers 347 and 349 include one or more non-magnetic metals, such as one or more of platinum (Pt), palladium (Pd), or iridium (Ir). In some embodiments, the non-magnetic layers (347B layers and 349B layers) in the multilayer structures of layers 347 and 349 have thicknesses (dimensions in the Y-axis direction) in the range of 0.2-1 nm (or in a sub-range of 0.2-0.4, 0.2-0.8, 0.4-0.8, 0.5-0.7, or 0.5-1 nm) or greater, or any other thickness value or range as can be understood based on this disclosure. In an example embodiment, the magnetic layers (347A layers and 349A layers) in the multilayer structures of layers 347 and 349 include (or are) cobalt and the non-magnetic layers (347B layers and 349B layers) in the multilayer structures of layers 347 and 349 include (or are) platinum. For instance, in such an example embodiment, the multilayer structure of layer 347 and/or 349 may include alternating layers of cobalt and platinum (Co/Pt). In another example embodiment, the multilayer structure of layer 347 and/or 349 may include alternating layers of cobalt and nickel (Co/Ni). In an example embodiment, the magnetic layers (347A layers and 349A layers) in the multilayer structures of layers 347 and 349 have thicknesses of exactly 0.4 nm or approximately 0.4 nm (e.g., within 0.1 nm of 0.4 nm, or 0.3-0.5 nm) and the non-magnetic layers (347B layers and 349B layers) in the multilayer structures of layers 347 and 349 have thicknesses of exactly 0.6 nm or approximately 0.6 nm (e.g., within 0.1 nm of 0.6 nm, or 0.5-0.7 nm).

More generally, first and second SAF stack layers 347 and 349, in some embodiments, include at least one magnetic metal and at least one non-magnetic metal. In some embodiments, first and second SAF stack layers 347 and 349 include one or more of Co, Ni, or Fe, and also include one or more of Pt, Pd, or Ir, for example. In some embodiments, first and second SAF stack layers 347 and 349 have thicknesses T7 and T9 (shown in FIG. 3F; dimensions in the Y-axis direction) in the range of 1-20 nm (or in a sub-range of 1-5, 1-10, 1-15, 2-8, 2-12, 2-20, 4-8, 4-12, 5-10, 5-15, 5-20, or 10-20 nm) or greater, or any thickness value or range as can be understood based on this disclosure. In some embodiments, first and second SAF stack layers 347 and 349 have thicknesses of at least 1, 2, 3, 4, 5, 6, 8, or 10 nm and/or at most 20, 18, 15, 12, 10, 8, or 6 nm, for example. In an example embodiment, first SAF stack layer 347 has a thickness T7 in the range of 2-12 nm, such as in the example embodiment described above where SAF stack layer 347 includes 3-5 sets of alternating magnetic and non-magnetic layers (plus the additional magnetic cap layer to complete the stack). In an example embodiment, second SAF stack layer 349 has a thickness T9 in the range of 5-15 nm, such as in the example embodiment described above where SAF stack layer 349 includes 6-7 sets of alternating magnetic and non-magnetic layers (plus the additional magnetic cap layer to complete the stack).

SAF stack coupling (or spacer) layer 348, in some embodiments, includes one or more non-magnetic metals. Recall that the SAF stack of the fixed magnetic structure 340 includes layers 347/348/349, such that layer 348 couples layers 347 and 349 in a synthetic antiferromagnetic manner. In some embodiments, SAF stack coupling layer 348 includes one or more of ruthenium (Ru), iridium (Ir), molybdenum (Mo), copper (Cu), or rhodium (Rh), for example. In an example embodiment, SAF stack coupling layer 348 is a ruthenium layer. In some embodiments, SAF stack coupling layer 348 provides means for antiferromagnetically coupling first and second SAF stack layers 347 and 349. In some embodiments, SAF stack coupling layer 348 includes a multilayer structure of two or more materially distinct sub-layers. In some embodiments, SAF stack coupling layer 348 has a thickness T8 (as shown in FIG. 3F; dimension in the Y-axis direction) in the range of 0.2-3 nm (or in a sub-range of 0.2-0.8, 0.2-1, 0.2-1.2, 0.2-1.5, 0.2-2, 0.4-1.2, 0.5-1, 0.5-2, 0.5-3, 0.8-2, 1-2, 1-3, or 2-3 nm) or greater, or any thickness value or range as can be understood based on this disclosure. In some embodiments, SAF stack coupling layer 348 has a thickness T8 of at least 0.2, 0.4, 0.5, 0.8, 1, 1.2, or 1.5 nm and/or at most 3, 2.5, 2, 1.8, 1.5, 1.2, 1, or 0.8 nm, for example. In some example embodiments, SAF stack coupling layer 348 has a thickness T8 of 0.4, 0.8-0.9, or 1.7-1.8 nm to provide a desired coupling effect.

Figure 3E:
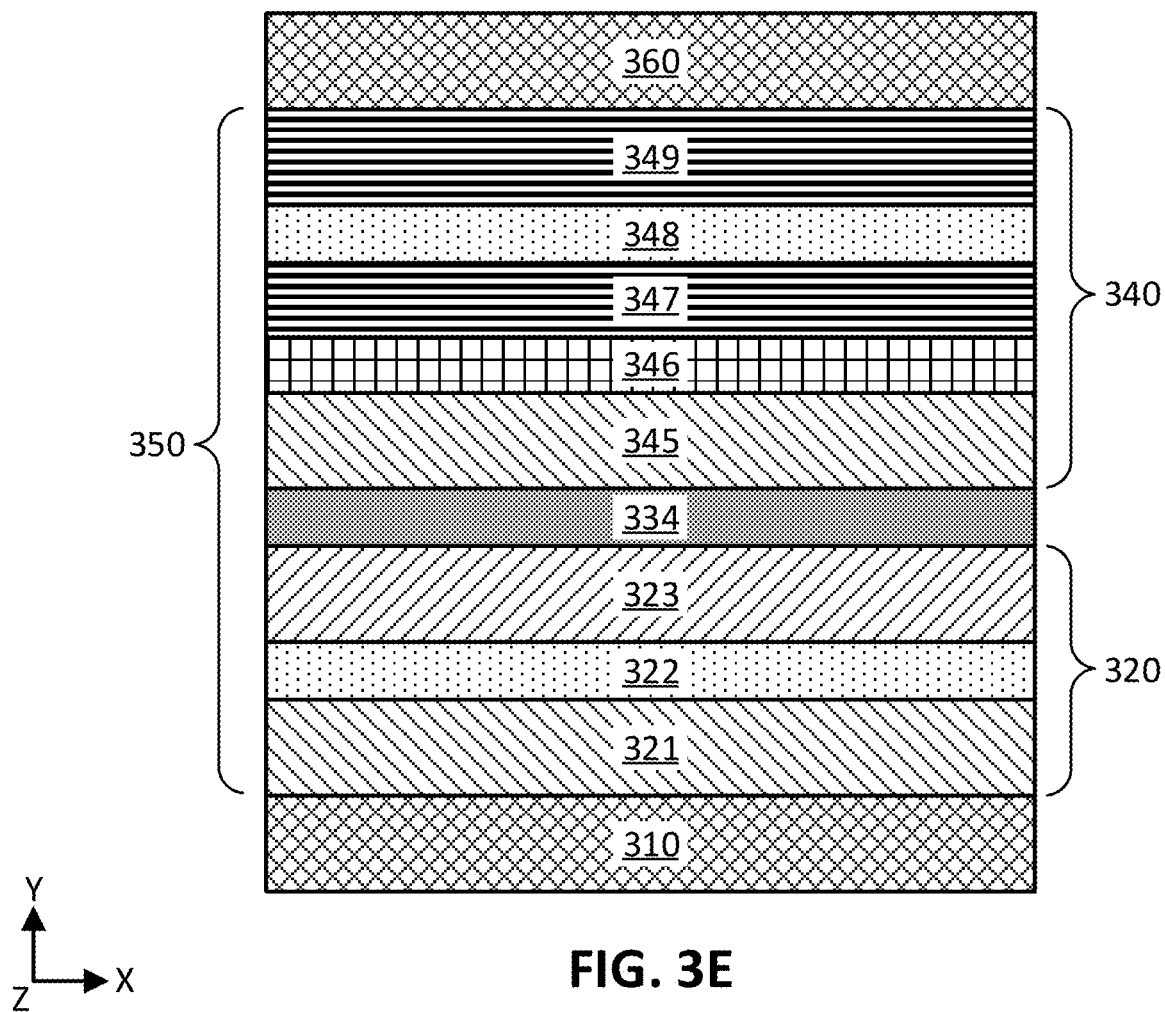
Figure 3F:
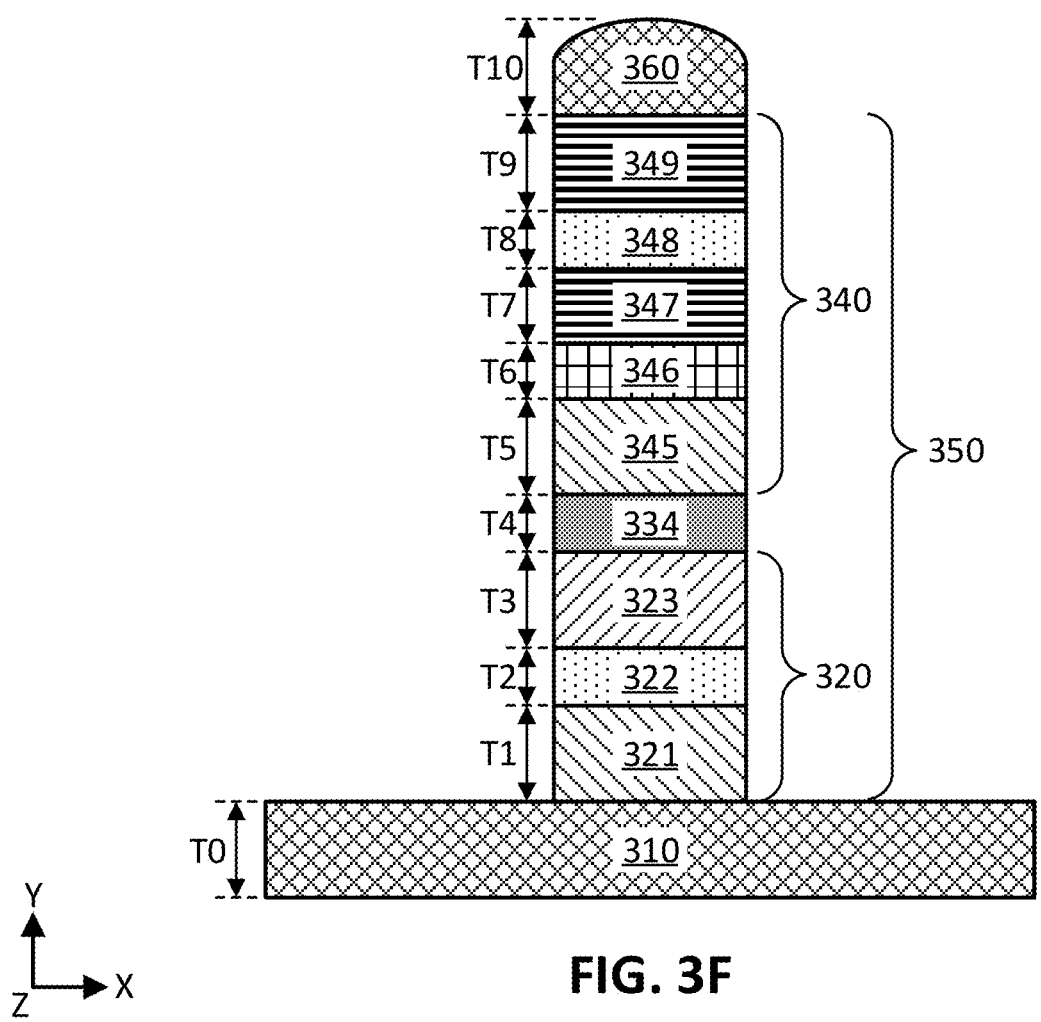

Method 200 of FIG. 2 continues with forming 210 a second electrode structure, such as the second electrode structure 360 shown in the example structure of FIG. 3E, in accordance with some embodiments. Second electrode structure 360 can be formed using any suitable techniques. For instance, in some embodiments, second electrode structure 360 is formed by blanket depositing the one or more layers included in the second electrode structure 360 and patterning/etching the one or more layers to the desired size and shape, for example. Further, in some embodiments, second electrode structure 360 is formed in a dielectric trench (not shown) by, for example, forming a dielectric layer, forming a trench in the dielectric layer, and then depositing the material of the second electrode structure 360 in the dielectric trench, for example. As shown in FIG. 3E, second electrode structure 360 is directly on fixed magnetic structure 340, and more specifically, directly on second SAF stack layer 349, in this example embodiment. In other embodiments, there are one or more intervening layers between second electrode structure 360 and fixed magnetic structure 340. Either way, it can be understood that the MTJ stack 350 is between first electrode structure 310 and second electrode structure 360, such as is shown in FIG. 3E.

Second electrode structure 360, in some embodiments, includes conductive material, such as one or more metals. In some embodiments, second electrode structure 360 includes one or more of tantalum (Ta), tungsten (W), titanium (Ti), or ruthenium (Ru), for example. In some embodiments, second electrode structure 360 includes nitrogen, such as with tantalum (e.g., TaN) and/or with titanium (e.g., TiN). In some embodiments, second electrode structure 360 has a thickness T10 (as shown in FIG. 3F; dimension in the Y-axis direction) in the range of 3-100 nm (or in a sub-range of 3-25, 3-50, 5-25, 5-50, 5-75, 5-100, 10-50, 10-100, 25-50, 25-100, or 50-100 nm) or greater, or any other suitable thickness value or range as can be understood based on this disclosure. In some embodiments, second electrode structure 360 has a thickness T10 of at least 3, 5, 10, 15, 25, or 50 nm and/or at most 100, 75, 50, 25, or 20 nm, for example. In an example embodiment, second electrode structure 360 has a thickness T10 between 5 and 100 nm.

Method 200 of FIG. 2 continues with completing 212 the integrated circuit processing. For instance, such additional processing can include, in some embodiments, forming a mask (or hard mask) on the structure of FIG. 3E to set the final size and shape of the MTJ stack 150, for example. Such a hard mask can include material (e.g., one or more dielectrics) that will allow the underlying stack of FIG. 3E to be patterned/etched to the final structure of FIG. 3F (where the mask is shown as completely removed). However, in other embodiments, the structure of FIG. 3F may be initially formed (without the intervening structure of FIG. 3E) such as in one or more dielectric trenches to obtain the desired shape of the MTJ stack 350 as shown in FIG. 3F, for example. In some embodiments, the top-down view of the stack (in the X-Z plane) may have a shape that is a circle, oval, ellipse, square, or rectangle, for example. In some embodiments, the first electrode structure 310, which is the bottom electrode in this configuration (but could be the top electrode if the device were formed in a relatively upside-down manner), may have a shape in a top-down view (in the X-Z plane) that is a square, rectangle, circle, oval, or ellipse, for example.

Figure 3G:
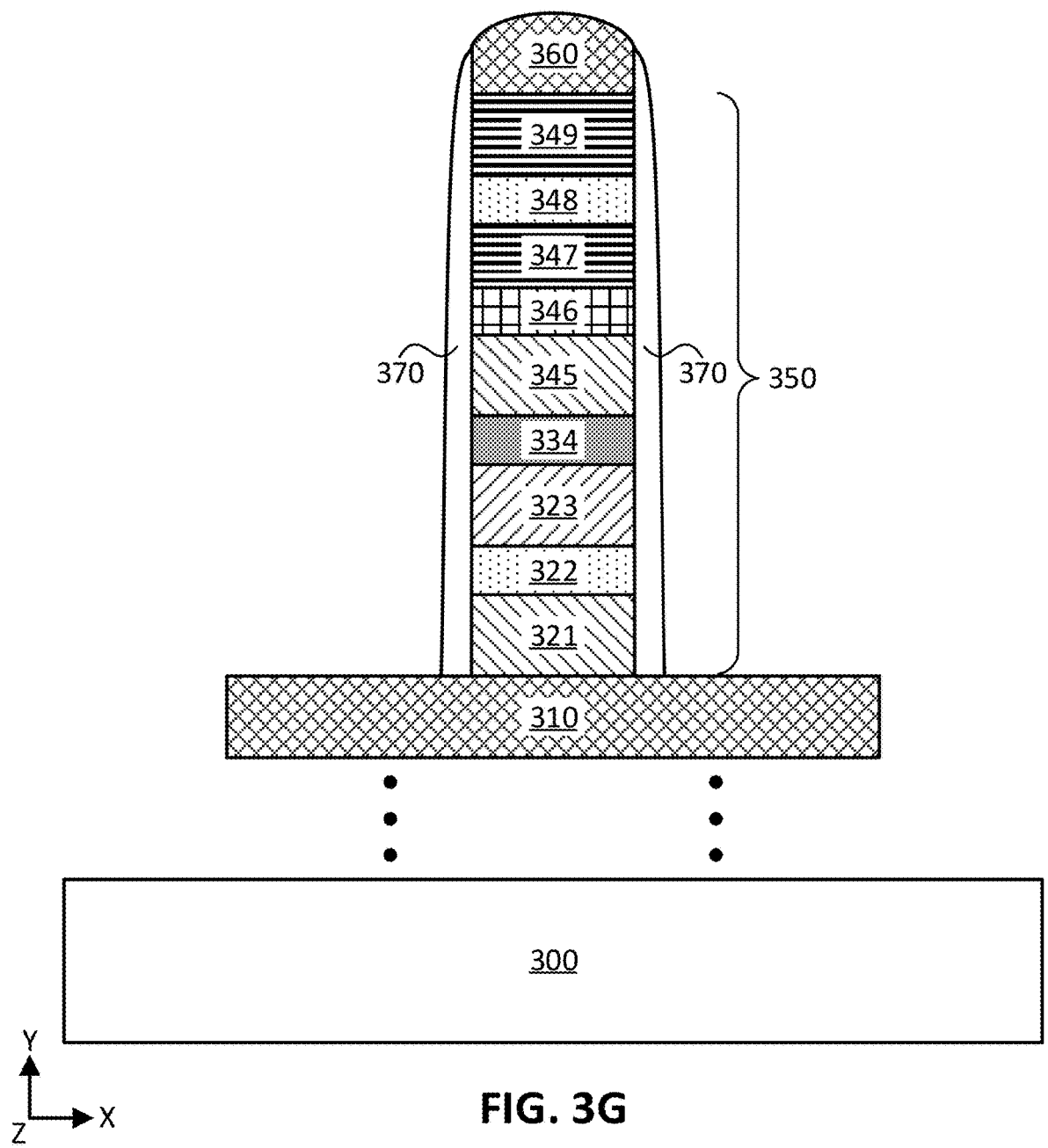

Further, the additional processing to complete the integrated circuit may include forming dielectric spacers 370 on either side of the MTJ stack 350, such as is shown in the example structure of FIG. 3G, in accordance with some embodiments. Such dielectric spacers 370 may be formed using any suitable techniques, such as forming the dielectric material of the spacers and etching the dielectric material to achieve the resulting structure show. Dielectric spacers 370, where included, include one or more dielectric materials, such as including an oxide (e.g., silicon dioxide), nitride (e.g., silicon nitride), high-k dielectric, low-k dielectric, and/or any other suitable electrically insulating material as can be understood based on this disclosure. In some embodiments, dielectric spacers 370 include silicon, oxygen, nitrogen, and/or carbon. For instance, in some embodiments, dielectric spacers 370 include silicon dioxide, silicon nitride, silicon oxynitride, or carbon-doped silicon dioxide (or other carbon-doped oxides).

Note that the layers in MTJ stack 350 include second digits that correspond to the structures in which they are included (e.g., layers 321-323 are in multilayer free magnetic structure 320 and layers 345-349 are in multilayer fixed magnetic structure 340). Also note that the last digit may be used to refer to the layers in the MTJ stack, such that layer 321 may be referred to as a first layer, layer 322 may be referred to as a second layer, and so forth to layer 349, which may be referred to as a ninth layer. Further note that the thicknesses T1-T9 align with that last digit of each layer, for ease of reference. In addition, the layer thicknesses described herein (e.g., thicknesses T0-T10) may be the maximum thickness for the corresponding layer or the thickness at a given location within the layer, such as at an outer location of the layer, in the middle of the layer, in a plane crossing through the layer, or any other suitable location as can be understood based on this disclosure.

Other additional processing to complete 212 the integrated circuit can include back-end or back-end-of-line (BEOL) processing to form one or more metallization layers and/or to interconnect the first and second electrode structures 310 and 360 to other devices and features. Note that the processes 202-212 of method 200 are shown in a particular order for ease of description, in accordance with some embodiments. However, one or more of the processes 202-212 can be performed in a different order or need not be performed at all, in other embodiments. Other variations as can be understood based on this disclosure may also occur. For instance, in some embodiments, the entire stack including layers 321, 322, 323, 334, 345, 346, 347, 348, 349, and 360 is deposited in situ and then patterned to form the structure of FIG. 3F. Numerous variations on method 200 and the techniques described herein will be apparent in light of this disclosure.

Figure 4:
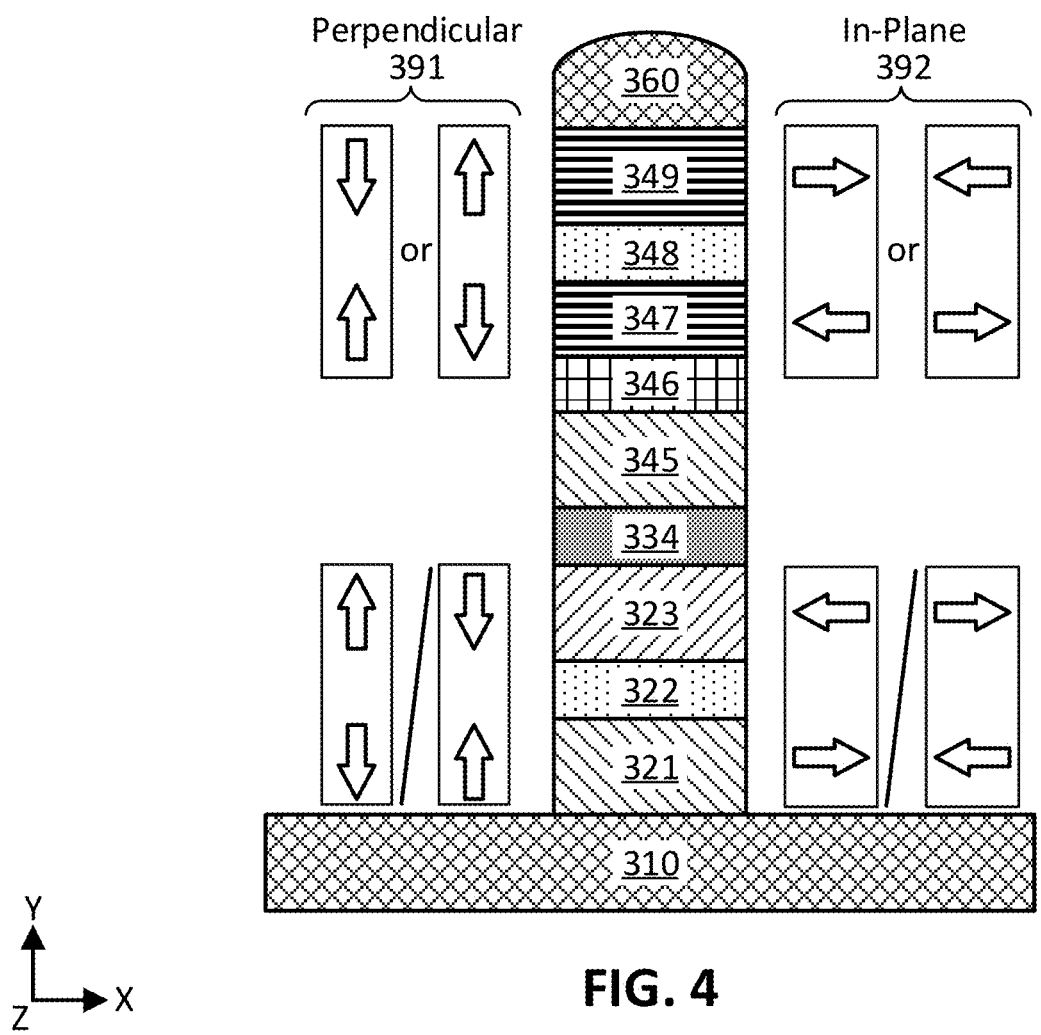
FIG. 4 illustrates the integrated circuit structure of FIG. 3F, including indications of magnetic orientation possibilities for perpendicular and in-plane configurations, in accordance with some embodiments.

FIG. 4 illustrates the integrated circuit structure of FIG. 3F, including indications of magnetic orientation possibilities for perpendicular 391 and in-plane 392 configurations, in accordance with some embodiments. For perpendicular (or out-of-plane) configurations 391, the magnetic orientation is perpendicular to the main plane of the layers in the MTJ stack 350 (or parallel to the main axis of the MTJ stack 350), as shown. Options for the perpendicular configurations 391 include the multilayer fixed magnetic structure 340 having orientations that point toward each other or away from each other, as shown. Further, for either perpendicular configuration 391 option, the multilayer free magnetic structure 320 is configured to switch between the magnetic orientations of the antiferromagnetically coupled magnetic layers pointing away from each other and pointing toward each other, as shown. Such switching occurs in response to the switching or critical current, as can be understood based on this disclosure. For in-plane (or parallel) configurations, the magnetic orientation is in-plane with the layers in the MTJ stack 350 (or perpendicular to the main axis of the MTJ stack 35), as shown. Options for the in-plane configurations 392 include the multilayer fixed magnetic structure 340 having orientations that point away from each other, but can either have the second SAF stack layer 349 pointing to the right (in the positive X-axis direction) or to the left (in the negative X-axis direction), while the remainder of the multilayer fixed magnetic structure 340 (e.g., the first SAF stack layer 347 influenced by third magnetic layer 345) includes the opposite orientation, as shown. Further, for either in-plane configuration 392 option, the multilayer free magnetic structure 320 is configured to switch between the first magnetic layer 321 orientation pointing to the right while the second magnetic layer 323 orientation points to the left, and vice versa (layer 321 oriented to the left and layer 323 oriented to the right), as shown. Such switching occurs in response to the switching or critical current, as can be understood based on this disclosure.

Figure 5:
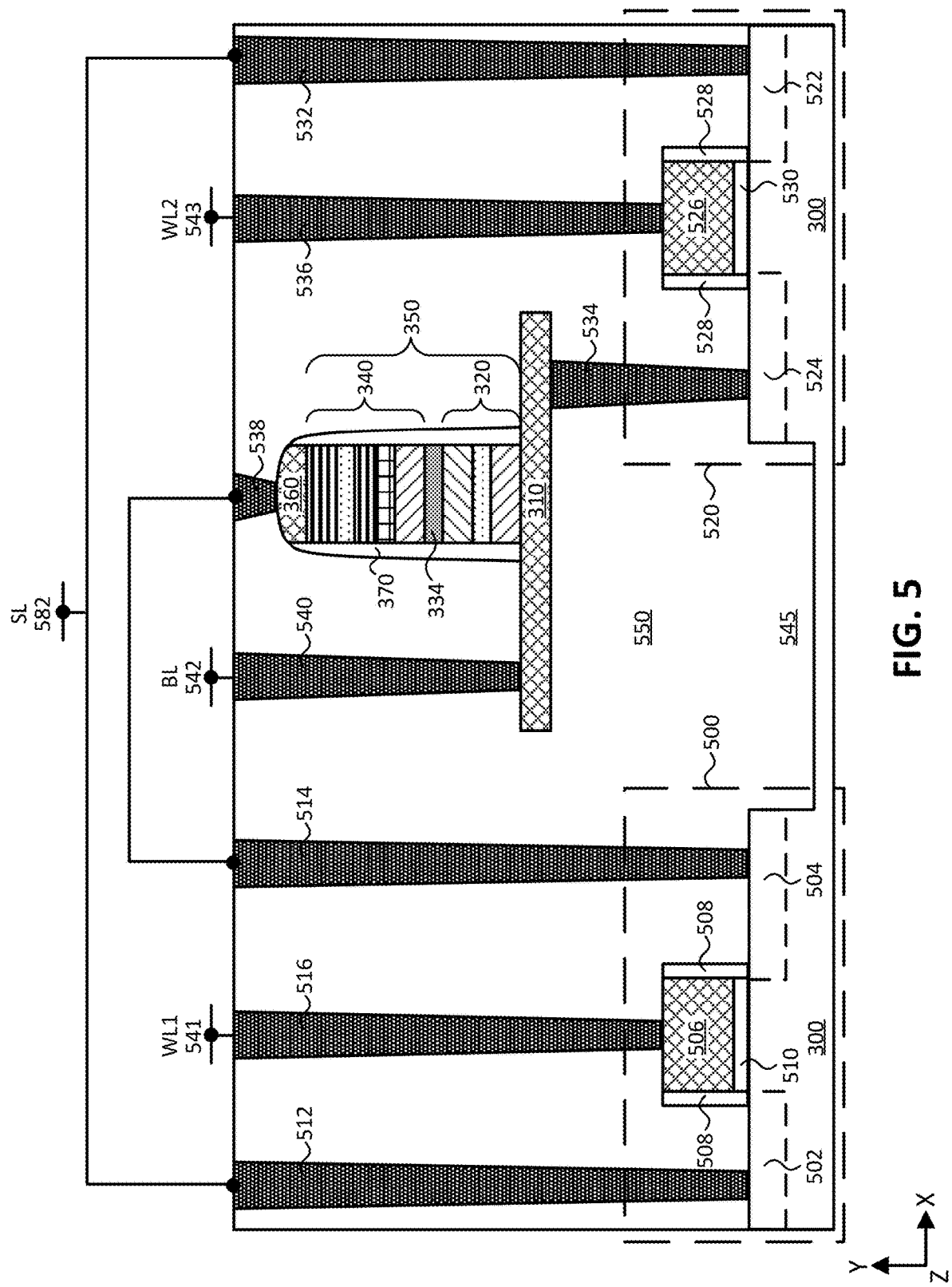
FIG. 5 illustrates a cross-sectional view of an IC structure including a spin-based magnetic memory device, in accordance with some embodiments. In more detail.

FIG. 5 illustrates a cross-sectional view of an integrated circuit (IC) structure including a spin-based magnetic memory device, in accordance with some embodiments. In more detail, the integrated circuit structure includes the structure of FIG. 3G, whereby the MTJ device (including MTJ stack 350 and electrode structures 310 and 360) is above substrate 300. Thus, the previous relevant description of the structure of FIG. 3G is equally applicable to the structure of FIG. 5. In this example embodiment, the spin-based magnetic memory device is a spin-orbit torque (SOT) memory device, as the MTJ device has three terminals. One of the terminals is in electrical contact with the second electrode structure 360 via interconnect structures 538 and 512, where that terminal is coupled with the drain region 504 of a first transistor 500, as shown. The other two terminals are in electrical contact with the first electrode structure 310 via interconnect structures 534 and 540, where those two terminals are coupled with the drain region 524 of the second transistor 520 and a bit line (BL) 542, respectively, as shown. However, the MTJ structures described herein can also be used for two-terminal spin-based memory devices, such as spin-transfer torque (STT) memory devices, for example. For instance, in such embodiments, first electrode structure 310 would only have one terminal (instead of having two, as shown in FIG. 5). Note that although the MTJ stack 350 including multilayer free magnetic structure 320 is formed at a back-end location of the IC structure of FIG. 5, in other embodiments, the MTJ stack 350 is formed at a front-end location of the IC structure (i.e., at the device level, such as where transistors 500 and 520 are formed).

In this example embodiment, first transistor 500 and second transistor 520 are formed on and from substrate 300. However, in other embodiments, one or both of the first and second transistors 500 and/or 520 are formed above substrate 300 but are not formed from substrate 300 (e.g., the transistors are formed using different material formed on or above substrate 300). In some embodiments, first and second transistors 500 and 520 are metal-oxide-semiconductor field-effect transistors (MOSFET) devices, for example. In some embodiments, the transistors 500 and 520 may be planar or nonplanar transistors, or a combination of both. Nonplanar transistors include finned transistors (such as FinFET transistors, which may be double-gate or tri-gate transistors) and gate-all-around (GAA) transistors (e.g., where the gate structure wraps around one or more nanowires or nanoribbons). Note that, in this example structure, dielectric structure 550 is shown as having one layer for ease of illustration, but is implemented with multiple dielectric layers, where the dielectric material can be any suitable dielectric (e.g., silicon oxide and/or silicon nitride). Also note that the first and second transistors 500 and 520 are electrically isolated by dielectric layer 545 (which may be referred to as a shallow trench isolation (STI) region), even though they are formed on common substrate 300.

First transistor 500, in the example structure of FIG. 5, includes source region 502, drain region 504, gate dielectric 510, gate electrode 506, and gate sidewall spacers 508. First transistor 500 also includes gate contact 516 above and electrically coupled to the gate electrode 506, source contact 512 above and electrically coupled to the source region 502, and a drain contact 514 above and electrically coupled to the drain region 504, as shown. Second transistor 520, in the example structure of FIG. 5, includes source region source region 522, drain region 524, gate dielectric 530, gate electrode 526, and gate sidewall spacers 528. Second transistor 520 also includes gate contact 536 above and electrically coupled to the gate electrode 526, source contact 532 above and electrically coupled to the source region 522, and a drain contact 534 above and electrically coupled to the drain region 524, as shown. Further, in this example structure, the source contact 512 of the first transistor 500 and the source contact 532 of the second transistor 520 are electrically connected via a shared source line (SL) 582.

Continuing with the example structure of FIG. 5, first electrode structure 301 is in electrical contact with the drain contact 534 of the second transistor 520. In addition, a first MTJ contact 538 is on and electrically coupled with second electrode structure 360, and that first MTJ contact 538 is electrically connected to drain contact 514 of the first transistor 500, as shown. Further, a second MTJ contact 540 is on and electrically coupled with first electrode structure 310, and that second MTJ contact 540 is electrically connected to bit line (BL) 542 of a memory array, as shown. Further yet, gate contact 516 of the first transistor 500 is electrically connected to a first wordline (WL1) 541 and gate contact 536 of the second transistor 520 is electrically connected to a second wordline (WL2) 543, where WL1 541 and WL2 543 are independently programmable.

Recall that the integrated circuit structure of FIG. 5 is provided as an example configuration for a spin-orbit torque (SOT) memory device, such as an SOT-MRAM device, for instance. In such a configuration, the MTJ device (including MTJ stack 350) has three terminals, where the second electrode structure 360 has one terminal (that is electrically connected to the drain region 504 of the first transistor 500, in this example structure) and the first electrode structure 310 (which may be considered an SOT electrode) has two terminals (that are electrically connected to the bit line 542 and the drain region of the second transistor 520, in this example structure). Also recall that the MTJ stack 350 as variously described herein can also be used for other spin-based magnetic memory devices, such as two-terminal spin-transfer torque (STT) memory devices (e.g., STT-MRAM devices). Numerous variations and configurations will be apparent in light of this disclosure.

Example System

Figure 6:
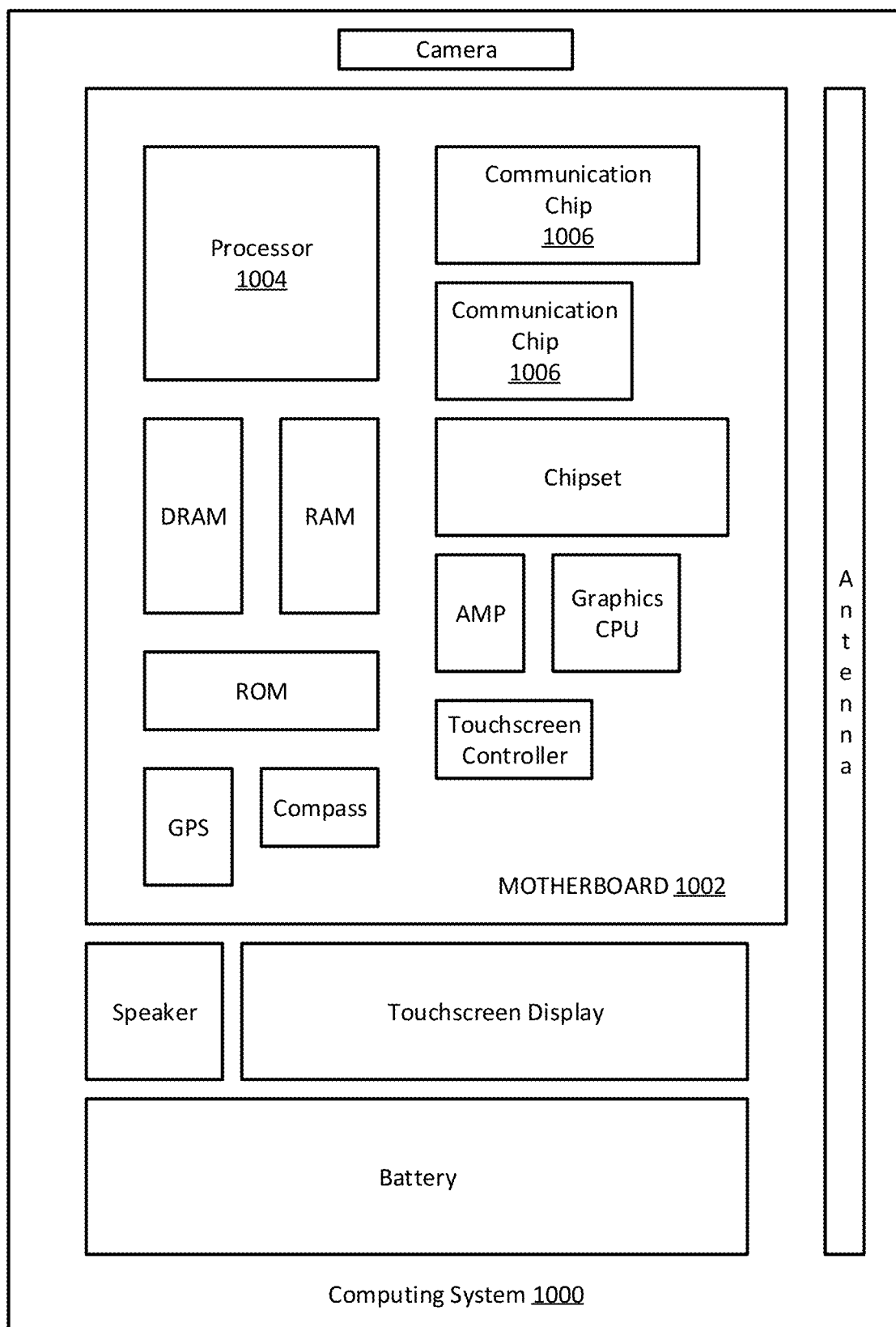
FIG. 6 illustrates a computing system implemented with integrated circuit structures and/or spin-based magnetic memory devices as disclosed herein, in accordance with some embodiments.

FIG. 6 illustrates a computing system 1000 implemented with integrated circuit structures and/or spin-based magnetic memory devices as disclosed herein, in accordance with some embodiments. For example, the MTJ devices including MTJ stack 350 having a multilayer free magnetic structure 320 that includes two magnets that antiferromagnetically coupled as variously disclosed herein can be included in one or more portions of computing system 1000. As can be seen, the computing system 1000 houses a motherboard 1002. The motherboard 1002 can include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 can include one or more other components that may or may not be physically and electrically coupled to the motherboard 1002. These other components can include, but are not limited to, volatile memory (e.g., DRAM or other types of RAM), non-volatile memory (e.g., ROM, ReRAM/RRAM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 can include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 can implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 can include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also can include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability can be integrated directly into the processor 1004 (e.g., where functionality of any chips 1006 is integrated into processor 1004, rather than having separate communication chips). Further note that processor 1004 can be a chip set having such wireless capability. In short, any number of processor 1004 and/or communication chips 1006 can be used. Likewise, any one chip or chip set can have multiple functions integrated therein.

In various implementations, the computing system 1000 can be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit including at least one memory device. The integrated circuit includes a first electrode structure, a second electrode structure, a free magnetic structure including a first multilayer stack (or simply, a first multilayer stack; the free magnetic structure and/or first multilayer stack including a first layer, a second layer, and a third layer), a fourth layer (or tunnel barrier layer), and a fixed magnetic structure including a second multilayer stack (or simply, a second multilayer stack). The first electrode structure includes one or more metals. The second electrode structure includes one or more metals. The free magnetic structure and/or first multilayer stack is between the first and second electrodes. The first layer includes one or more ferromagnetic materials. The second layer includes one or more of ruthenium, iridium, molybdenum, copper, or rhodium. The third layer includes one or more ferromagnetic materials. The second layer is between the first and third layers. The fourth layer is between the free magnetic structure (and/or first multilayer stack) and the second electrode. The fourth layer includes oxygen. The fourth layer further includes magnesium and/or aluminum. The fixed magnetic structure is between the fourth layer and the second electrode structure (such that the fourth layer is between the fixed magnetic structure and the free magnetic structure).

Example 2 includes the subject matter of Example 1, wherein the one or more metals included in the first electrode structure include one or more of tantalum, tungsten, platinum, bismuth, iridium, or manganese.

Example 3 includes the subject matter of Example 1 or 2, wherein the one or more metals included in the first electrode structure include iridium and manganese.

Example 4 includes the subject matter of any of Examples 1-3, wherein the one or more ferromagnetic materials included in the first and third layers include one or more of cobalt, iron, boron, molybdenum, tungsten, or tantalum.

Example 5 includes the subject matter of any of Examples 1-4, wherein the one or more ferromagnetic materials included in the first and third layers include boron.

Example 6 includes the subject matter of any of Examples 1-5, wherein the one or more ferromagnetic materials included in the first and third layers includes one or more of CoFeB, FeB, CoB, or CoFeBMo.

Example 7 includes the subject matter of any of Examples 1-6, wherein the first and third layers include the same one or more ferromagnetic materials.

Example 8 includes the subject matter of any of Examples 1-7, wherein the first layer has a thickness within 0.1, 0.2, 0.3, 0.4, 0.5, 0.8, or 1 nanometer of a thickness of the third layer.

Example 9 includes the subject matter of any of Examples 1-8, wherein the first and third layers have thicknesses of less than 5, 3, 2, 1.5, or 1 nanometer.

Example 10 includes the subject matter of any of Examples 1-9, wherein the second multilayer stack includes a synthetic antiferromagnetic (SAF) stack, the SAF stack including a first SAF stack layer, a second SAF stack layer, and a coupling layer between the first and second SAF stack layers, the coupling layer including one or more of ruthenium, iridium, molybdenum, copper, or rhodium.

Example 11 includes the subject matter of Example 10, wherein the second multilayer stack further includes a magnetic layer including one or more ferromagnetic materials, and a tantalum layer between the magnetic layer and the SAF stack.

Example 12 includes the subject matter of any of Examples 1-11, wherein the at least one memory device is a spin-based magnetic memory device.

Example 13 includes the subject matter of any of Examples 1-12, wherein the at least one memory device is a spin-torque transfer (STT) memory device.

Example 14 includes the subject matter of any of Examples 1-12, further comprising a first transistor, a second transistor, and a bit line, the second electrode structure electrically connected to the first transistor, the first electrode structure electrically connected to the first transistor and the bit line.

Example 15 includes the subject matter of any of Examples 1-12 or 14, wherein the at least one memory device is a three-terminal spin-orbit torque (SOT) memory device.

Example 16 includes the subject matter of any of Examples 1-12, 14, or 15, wherein the at least one memory device is a perpendicular spin-orbit torque (pSOT) memory device.

Example 17 includes the subject matter of any of Examples 1-16, wherein the first electrode structure has a thickness between 2 and 25 nanometers (or less than 10 nanometers).

Example 18 includes the subject matter of any of Examples 1-17, wherein the second electrode structure has a thickness between 5 and 100 nanometers (or between 10 and 70 nanometers).

Example 19 includes the subject matter of any of Examples 1-18, wherein the first layer has a thickness between 0.5 and 5 nanometers (or between 0.5 and 2 nanometers or between 0.9 and 1.1 nanometers).

Example 20 includes the subject matter of any of Examples 1-19, wherein the second layer has a thickness between 0.2 and 3 nanometers (or between 0.2 and 2 nanometers).

Example 21 includes the subject matter of any of Examples 1-20, wherein the third layer has a thickness between 0.5 and 5 nanometers (or between 0.5 and 2 nanometers or between 0.9 and 1.1 nanometers).

Example 22 includes the subject matter of any of Examples 1-21, wherein the fourth layer has a thickness between 0.5 and 2 nanometers (or between 1 and 2 nanometers).

Example 23 is a computing system comprising the subject matter of any of Examples 1-22.

Example 24 is an integrated circuit including at least one memory device. The integrated circuit includes a first electrode structure, a second electrode structure, a first multilayer stack (including a first layer, a second layer, and a third layer), a fourth layer, and a second multilayer stack (including a fifth layer, a sixth layer, a seventh layer, an eighth layer, and a ninth layer). The first electrode structure includes one or more metals. The second electrode structure includes one or more metals. The first multilayer stack is between the first and second electrodes. The first layer includes one or more of cobalt, iron, or boron. The second layer includes one or more of ruthenium, iridium, molybdenum, copper, or rhodium. The third layer includes one or more of cobalt, iron, or boron. The second layer is between the first and third layers. The fourth layer is between the first multilayer stack and the second electrode structure. The fourth layer includes magnesium and oxygen. The second multilayer stack is between the fourth layer and the second electrode structure (such that the fourth layer is between the first and second multilayer stacks). The fifth layer includes one or more of cobalt, iron, or boron. The sixth layer includes one or more of tantalum, molybdenum, tungsten, or ruthenium. The seventh layer includes at least one magnetic metal (e.g., cobalt, nickel) and at least one non-magnetic metal (e.g., platinum, palladium). The eighth layer includes one or more of ruthenium, iridium, molybdenum, copper, or rhodium. The ninth layer includes at least one magnetic metal (e.g., cobalt, nickel) and at least one non-magnetic metal (e.g., platinum, palladium). The eighth layer is between the seventh and ninth layers.

Example 25 includes the subject matter of Example 24, wherein the one or more metals included in the first electrode structure include one or more of tantalum, tungsten, platinum, bismuth, iridium, or manganese.

Example 26 includes the subject matter of Example 24 or 25, wherein the one or more metals included in the first electrode structure include iridium and manganese.

Example 27 includes the subject matter of any of Examples 24-26, wherein the first and third layers include boron.

Example 28 includes the subject matter of any of Examples 24-27, wherein the first and third layers include one or more of CoFeB, FeB, CoB, or CoFeBMo.

Example 29 includes the subject matter of any of Examples 24-28, wherein the first and third layers include one or more ferromagnetic materials.

Example 30 includes the subject matter of any of Examples 24-29, wherein the first and third layers include the same material.

Example 31 includes the subject matter of any of Examples 24-30, wherein the first layer has a thickness within 0.1, 0.2, 0.3, 0.4, 0.5, 0.8, or 1 nanometer of a thickness of the third layer.

Example 32 includes the subject matter of any of Examples 24-31, wherein the first and third layers have thicknesses of less than 5, 3, 2, 1.5, or 1 nanometer.

Example 33 includes the subject matter of any of Examples 24-32, wherein the seventh and ninth layers include a multilayer structure, the multilayer structure including at least one magnetic layer and at least one non-magnetic layer.

Example 34 includes the subject matter of Example 33, wherein the at least one magnetic layer included in the multilayer structure of the seventh and ninth layers includes cobalt, and the at least one non-magnetic layer included in the multilayer structure of the seventh and ninth layers includes platinum.

Example 35 includes the subject matter of any of Examples 24-34, wherein the at least one memory device is a spin-based magnetic memory device.

Example 36 includes the subject matter of any of Examples 24-35, wherein the at least one memory device is a spin-torque transfer (STT) memory device.

Example 37 includes the subject matter of any of Examples 24-35, further comprising a first transistor, a second transistor, and a bit line, the second electrode structure electrically connected to the first transistor, the first electrode structure electrically connected to the first transistor and the bit line.

Example 38 includes the subject matter of any of Examples 24-35 or 37, wherein the at least one memory device is a three-terminal spin-orbit torque (SOT) memory device.

Example 39 includes the subject matter of any of Examples 24-35, 37, or 38, wherein the at least one memory device is a perpendicular spin-orbit torque (pSOT) memory device.

Example 40 includes the subject matter of any of Examples 24-39, wherein the first electrode structure has a thickness between 2 and 25 nanometers (or less than 10 nanometers).

Example 41 includes the subject matter of any of Examples 24-40, wherein the second electrode structure has a thickness between 5 and 100 nanometers (or between 10 and 70 nanometers).

Example 42 includes the subject matter of any of Examples 24-41, wherein the first layer has a thickness between 0.5 and 5 nanometers (or between 0.5 and 2 nanometers or between 0.9 and 1.1 nanometers).

Example 43 includes the subject matter of any of Examples 24-42, wherein the second layer has a thickness between 0.2 and 3 nanometers (or between 0.2 and 2 nanometers).

Example 44 includes the subject matter of any of Examples 24-43, wherein the third layer has a thickness between 0.5 and 5 nanometers (or between 0.5 and 2 nanometers or between 0.9 and 1.1 nanometers).

Example 45 includes the subject matter of any of Examples 24-44, wherein the fourth layer has a thickness between 0.5 and 2 nanometers (or between 1 and 2 nanometers).

Example 46 includes the subject matter of any of Examples 24-45, wherein the fifth layer has a thickness between 0.5 and 5 nanometers.

Example 47 includes the subject matter of any of Examples 24-46, wherein the sixth layer has a thickness between 0.2 and 1 nanometer.

Example 48 includes the subject matter of any of Examples 24-47, wherein the seventh layer has a thickness between 2 and 12 nanometers.

Example 49 includes the subject matter of any of Examples 24-48, wherein the eighth layer has a thickness between 0.3 and 2 nanometers.

Example 50 includes the subject matter of any of Examples 24-49, wherein the ninth layer has a thickness between 5 and 15 nanometers.

Example 51 is a computing system comprising the subject matter of any of Examples 24-50.

Example 52 is a method of forming the subject matter of any of Examples 1-51. The method includes at least forming the first electrode structure, forming the second electrode structure, forming the free magnetic structure and/or first multilayer stack (that includes a first layer, a second layer, and a third layer), forming the fourth layer, and forming the fixed magnetic structure and/or second multilayer stack.

Example 53 includes the subject matter of Example 52, wherein the free magnetic structure and/or first multilayer stack, the fourth layer, and the fixed magnetic structure and/or second multilayer stack are all formed prior to forming the second electrode structure.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one memory device, the integrated circuit comprising: a first electrode structure including one or more metals; a second electrode structure including one or more metals; a free magnetic structure between the first and second electrode structures, the free magnetic structure comprising a first multilayer stack including a first layer including one or more ferromagnetic materials, a second layer including copper, and a third layer including one or more ferromagnetic materials, the second layer between the first and third layers; a fourth layer between the free magnetic structure and the second electrode structure, the fourth layer including oxygen, the fourth layer further including magnesium or aluminum, or both magnesium and aluminum; and a fixed magnetic structure between the fourth layer and the second electrode structure, the fixed magnetic structure comprising a second multilayer stack and further comprising a first transistor, a second transistor, and a bit line, the second electrode structure electrically connected to the first transistor, the first electrode structure electrically connected to the first transistor and the bit line.

2. The integrated circuit of claim 1, wherein the one or more metals included in the first electrode structure include one or more of tantalum, tungsten, platinum, bismuth, iridium, or manganese.

3. The integrated circuit of claim 2, wherein the one or more metals included in the first electrode structure include iridium and manganese.

4. The integrated circuit of claim 1, wherein the one or more ferromagnetic materials included in the first and third layers include one or more of cobalt, iron, boron, molybdenum, tungsten, or tantalum.

5. The integrated circuit of claim 1, wherein the one or more ferromagnetic materials included in the first and third layers include boron.

6. The integrated circuit of claim 1, wherein the first and third layers include the same one or more ferromagnetic materials.

7. The integrated circuit of claim 1, wherein the first layer has a thickness within 0.5 nanometers of a thickness of the third layer.

8. The integrated circuit of claim 1, wherein the first and third layers have thicknesses of less than 2 nanometers.

9. The integrated circuit of claim 1, wherein the second multilayer stack includes a synthetic antiferromagnetic (SAF) stack, the SAF stack including a first SAF stack layer, a second SAF stack layer, and a coupling layer between the first and second SAF stack layers, the coupling layer including one or more of ruthenium, iridium, molybdenum, copper, or rhodium.

10. The integrated circuit of claim 9, wherein the second multilayer stack further includes a magnetic layer including one or more ferromagnetic materials, and a tantalum layer between the magnetic layer and the SAF stack.

11. The integrated circuit of claim 1, further comprising a first transistor, a second transistor, and a bit line, the second electrode structure electrically connected to the first transistor, the first electrode structure electrically connected to the first transistor and the bit line.

12. The integrated circuit of claim 1, wherein the at least one memory device is a three-terminal spin-orbit torque (SOT) memory device.

13. The integrated circuit of claim 1, wherein the at least one memory device is a perpendicular spin-orbit torque (pSOT) memory device.

14. A computing system comprising the integrated circuit of claim 1.

15. An integrated circuit including at least one spin-based magnetic memory device, the integrated circuit comprising: a first electrode structure including one or more of tantalum, tungsten, platinum, bismuth, iridium, or manganese; a second electrode structure including one or more metals; a first multilayer stack between the first and second electrode structures, the first multilayer stack including a first layer including one or more of cobalt, iron, or boron, a second layer including copper, and a third layer including one or more of cobalt, iron, or boron, the second layer between the first and third layers; a fourth layer between the first multilayer stack and the second electrode structure, the fourth layer including magnesium and oxygen; and a second multilayer stack between the fourth layer and the second electrode structure, the second multilayer stack including a fifth layer including one or more of cobalt, iron, or boron, a sixth layer including tantalum, a seventh layer including cobalt and platinum, an eighth layer including one or more of ruthenium, iridium, molybdenum, copper, or rhodium, and a ninth layer including cobalt and platinum, the eighth layer between the seventh and ninth layers and wherein the first electrode structure has a thickness between 2 and 25 nanometers (nm), the second electrode structure has a thickness between 5 and 100 nm, the first layer has a thickness between 0.5 and 5 nm, the second layer has a thickness between 0.2 and 3 nm, the third layer has a thickness between 0.5 and 5 nm, the fourth layer has a thickness between 0.5 and 2 nm, the fifth layer has a thickness between 0.5 and 5 nm, the sixth layer has a thickness between 0.2 and 1 nm, the seventh layer has a thickness between 2 and 12 nm, the eighth layer has a thickness between 0.3 and 2 nm, and the ninth layer has a thickness between 5 and 15 nm.

16. The integrated circuit of claim 15, wherein the first electrode structure has a thickness between 2 and 25 nanometers (nm), the second electrode structure has a thickness between 5 and 100 nm, the first layer has a thickness between 0.5 and 5 nm, the second layer has a thickness between 0.2 and 3 nm, the third layer has a thickness between 0.5 and 5 nm, the fourth layer has a thickness between 0.5 and 2 nm, the fifth layer has a thickness between 0.5 and 5 nm, the sixth layer has a thickness between 0.2 and 1 nm, the seventh layer has a thickness between 2 and 12 nm, the eighth layer has a thickness between 0.3 and 2 nm, and the ninth layer has a thickness between 5 and 15 nm.

17. The integrated circuit of claim 15, wherein the seventh and ninth layers include a multilayer structure, the multilayer structure including at least one layer of cobalt and at least one layer of platinum.

18. The integrated circuit of claim 15, wherein the at least one spin-based magnetic memory device is a perpendicular spin-orbit torque memory device.

19. A method of forming an integrated circuit including at least one memory device, the method comprising: forming a first electrode structure including one or more metals; forming a second electrode structure including one or more metals; forming a free magnetic structure between the first and second electrode structures, the free magnetic structure comprising a first multilayer stack including a first layer including one or more ferromagnetic materials, a second layer including copper, and a third layer including one or more ferromagnetic materials, the second layer between the first and third layers; forming a fourth layer between the free magnetic structure and the second electrode structure, the fourth layer including oxygen and one or more metals; and forming a fixed magnetic structure between the fourth layer and the second electrode structure, the fixed magnetic structure comprising a second multilayer stack, and further comprising a first transistor, a second transistor, and a bit line, the second electrode structure electrically connected to the first transistor, the first electrode structure electrically connected to the first transistor and the bit line.

20. The method of claim 19, wherein the free magnetic structure, fourth layer, and fixed magnetic structure are all formed prior to forming the second electrode structure.

21. An integrated circuit including at least one memory device, the integrated circuit comprising:
a first electrode structure including one or more metals, wherein the one or more metals included in the first electrode structure include iridium and manganese;
a second electrode structure including one or more metals;
a free magnetic structure between the first and second electrode structures, the free magnetic structure comprising a first multilayer stack including a first layer including one or more ferromagnetic materials, a second layer including one or more of ruthenium, iridium, molybdenum, copper, or rhodium, and a third layer including one or more ferromagnetic materials, the second layer between the first and third layers;

a fourth layer between the free magnetic structure and the second electrode structure, the fourth layer including oxygen, the fourth layer further including magnesium or aluminum, or both magnesium and aluminum; and a fixed magnetic structure between the fourth layer and the second electrode structure, the fixed magnetic structure comprising a second multilayer stack.

22. An integrated circuit including at least one memory device, the integrated circuit comprising:

a first electrode structure including one or more metals;

a second electrode structure including one or more metals;

a free magnetic structure between the first and second electrode structures, the free magnetic structure comprising a first multilayer stack including a first layer including one or more ferromagnetic materials, a second layer including one or more of ruthenium, iridium, molybdenum, copper, or rhodium, and a third layer including one or more ferromagnetic materials, the second layer between the first and third layers;

a fourth layer between the free magnetic structure and the second electrode structure, the fourth layer including oxygen, the fourth layer further including magnesium or aluminum, or both magnesium and aluminum;

a fixed magnetic structure between the fourth layer and the second electrode structure, the fixed magnetic structure comprising a second multilayer stack;

a first transistor;

a second transistor; and a bit line, the second electrode structure electrically connected to the first transistor, the first electrode structure electrically connected to the first transistor and the bit line.

23. An integrated circuit including at least one spin-based magnetic memory device, the integrated circuit comprising:

a first electrode structure including one or more of tantalum, tungsten, platinum, bismuth, iridium, or manganese; a second electrode structure including one or more metals;

a first multilayer stack between the first and second electrode structures, the first multilayer stack including a first layer including one or more of cobalt, iron, or boron, a second layer including one or more of ruthenium, iridium, molybdenum, copper, or rhodium, and a third layer including one or more of cobalt, iron, or boron, the second layer between the first and third layers;

a fourth layer between the first multilayer stack and the second electrode structure, the fourth layer including magnesium and oxygen; and a second multilayer stack between the fourth layer and the second electrode structure, the second multilayer stack including a fifth layer including one or more of cobalt, iron, or boron, a sixth layer including tantalum, a seventh layer including cobalt and platinum, an eighth layer including one or more of ruthenium, iridium, molybdenum, copper, or rhodium, and a ninth layer including cobalt and platinum, the eighth layer between the seventh and ninth layers, wherein the first electrode structure has a thickness between 2 and 25 nanometers (nm), the second electrode structure has a thickness between 5 and 100 nm, the first layer has a thickness between 0.5 and 5 nm, the second layer has a thickness between 0.2 and 3 nm, the third layer has a thickness between 0.5 and 5 nm, the fourth layer has a thickness between 0.5 and 2 nm, the fifth layer has a thickness between 0.5 and 5 nm, the sixth layer has a thickness between 0.2 and 1 nm, the seventh layer has a thickness between 2 and 12 nm, the eighth layer has a thickness between 0.3 and 2 nm, and the ninth layer has a thickness between 5 and 15 nm.

\* \* \* \* \*